(12) United States Patent
Shishido et al.

(10) Patent No.: US 12,207,483 B2
(45) Date of Patent: Jan. 21, 2025

(54) IMAGING DEVICE

(71) Applicant: Panasonic Intellectual Property Management Co., Ltd., Osaka (JP)

(72) Inventors: Sanshiro Shishido, Osaka (JP); Takahiro Koyanagi, Osaka (JP); Yuuko Tomekawa, Osaka (JP); Shinichi Machida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 423 days.

(21) Appl. No.: 17/347,460

(22) Filed: Jun. 14, 2021

(65) Prior Publication Data

US 2021/0313399 A1    Oct. 7, 2021

Related U.S. Application Data

(63) Continuation of application No. PCT/JP2020/011717, filed on Mar. 17, 2020.

(30) Foreign Application Priority Data

Apr. 25, 2019  (JP) ................................ 2019-084259

(51) Int. Cl.
*H10K 39/32*    (2023.01)
*H10K 30/30*    (2023.01)

(52) U.S. Cl.
CPC ........... *H10K 39/32* (2023.02); *H10K 30/353* (2023.02)

(58) Field of Classification Search
CPC ..................................... H01L 27/14609–14612
See application file for complete search history.

(56) References Cited

U.S. PATENT DOCUMENTS

2008/0237481 A1  10/2008  Zentai et al.
2011/0049665 A1*  3/2011  Goto ................. H01L 27/14632
                                    257/E31.124
(Continued)

FOREIGN PATENT DOCUMENTS

JP    2012-114160    6/2012
JP    2016-086231    5/2016
(Continued)

OTHER PUBLICATIONS

International Search Report of PCT application No. PCT/JP2020/011717 dated Jun. 23, 2020.

*Primary Examiner* — Evren Seven
(74) *Attorney, Agent, or Firm* — Rimon P.C.

(57) ABSTRACT

An imaging device includes a first pixel and a second pixel adjacent to the first pixel. Each of the first pixel and the second pixel includes a first electrode, a second electrode positioned on or above the first electrode and facing the first electrode, a photoelectric conversion layer positioned between the first electrode and the second electrode, and a first charge-blocking layer positioned between the first electrode and the photoelectric conversion layer. The first charge-blocking layer of the first pixel is separated from the first charge-blocking layer of the second pixel. The photoelectric conversion layer is disposed continuously to the first pixel and the second pixel. An area of the first charge-blocking layer of the first pixel is larger than an area of the first electrode of the first pixel in plan view.

13 Claims, 12 Drawing Sheets

(56) References Cited

U.S. PATENT DOCUMENTS

| | | | |
|---|---|---|---|
| 2012/0313142 A1* | 12/2012 | Suzuki | H01L 27/14645 |
| | | | 257/184 |
| 2014/0027619 A1* | 1/2014 | Ishii | H04N 25/745 |
| | | | 250/208.1 |
| 2015/0137199 A1 | 5/2015 | Mori et al. | |
| 2015/0146061 A1* | 5/2015 | Ishii | H04N 25/709 |
| | | | 348/301 |
| 2015/0188064 A1* | 7/2015 | Kim | H01L 27/14643 |
| | | | 257/40 |
| 2016/0119563 A1 | 4/2016 | Yamada et al. | |
| 2016/0211392 A1* | 7/2016 | So | H01L 31/101 |
| 2016/0336363 A1* | 11/2016 | Dairiki | H01L 29/7869 |
| 2017/0005126 A1* | 1/2017 | Yamazaki | H01L 31/022475 |
| 2017/0263669 A1* | 9/2017 | Tamaki | H04N 25/709 |
| 2018/0076252 A1* | 3/2018 | Togashi | H01L 27/14627 |
| 2018/0323390 A1* | 11/2018 | Kaneda | H01L 27/14645 |
| 2021/0020857 A1* | 1/2021 | Hirata | H10K 39/32 |

FOREIGN PATENT DOCUMENTS

| | | |
|---|---|---|
| JP | 2016-127264 | 7/2016 |
| JP | 2018-125495 | 8/2018 |
| JP | 2018-152393 | 9/2018 |
| WO | 2014/002332 | 1/2014 |
| WO | 2018/163720 | 9/2018 |

* cited by examiner

IMAGING DEVICE

BACKGROUND

1. Technical Field

The present disclosure relates to an imaging device.

2. Description of the Related Art

Laminated-type imaging devices with a photoelectric conversion element disposed on a semiconductor substrate have been available. In the laminated-type imaging device, a photoelectric conversion layer of the photoelectric conversion element may be manufactured of a material different from that of the semiconductor substrate. As disclosed in Japanese Unexamined Patent Application Publication Nos. 2018-152393 and 2016-127264, the photoelectric conversion layer is manufactured of an inorganic material or an organic material, different from a related-art semiconductor material, such as silicon. Thus, an imaging device having physical characteristics or functions different from those of related-art imaging devices may be manufactured. For example, the imaging device has a sensitivity in a wavelength band different from a wavelength band of the related art. The laminated-type imaging device may include a charge-blocking layer laminated between a photoelectric conversion layer and an electrode to control the flowing of charges different from signal charges into the photoelectric conversion layer from an electrode that captures the signal charges.

SUMMARY

In one general aspect, the techniques disclosed here feature an imaging device including a first pixel and a second pixel adjacent to the first pixel. Each of the first pixel and the second pixel includes a first electrode, a second electrode positioned on or above the first electrode and facing the first electrode, a photoelectric conversion layer positioned between the first electrode and the second electrode, and a first charge-blocking layer positioned between the first electrode and the photoelectric conversion layer. The first charge-blocking layer of the first pixel is separated from the first charge-blocking layer of the second pixel. The photoelectric conversion layer is disposed continuously to the first pixel and the second pixel. An area of the first charge-blocking layer of the first pixel is larger than an area of the first electrode of the first pixel in plan view.

In another aspect, the techniques disclosed here feature an imaging device including a first pixel and a second pixel adjacent to the first pixel. Each of the first pixel and the second pixel includes a first electrode, a second electrode positioned on or above the first electrode and facing the first electrode, a photoelectric conversion layer positioned between the first electrode and the second electrode, a first charge-blocking layer positioned between the first electrode and the photoelectric conversion layer. The first charge-blocking layer of the first pixel is separated from the first charge-blocking layer of the second pixel. The photoelectric conversion layer is disposed continuously to the first pixel and the second pixel. An area of the first charge-blocking layer of the first pixel is smaller than an area of the first electrode of the first pixel in plan view.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
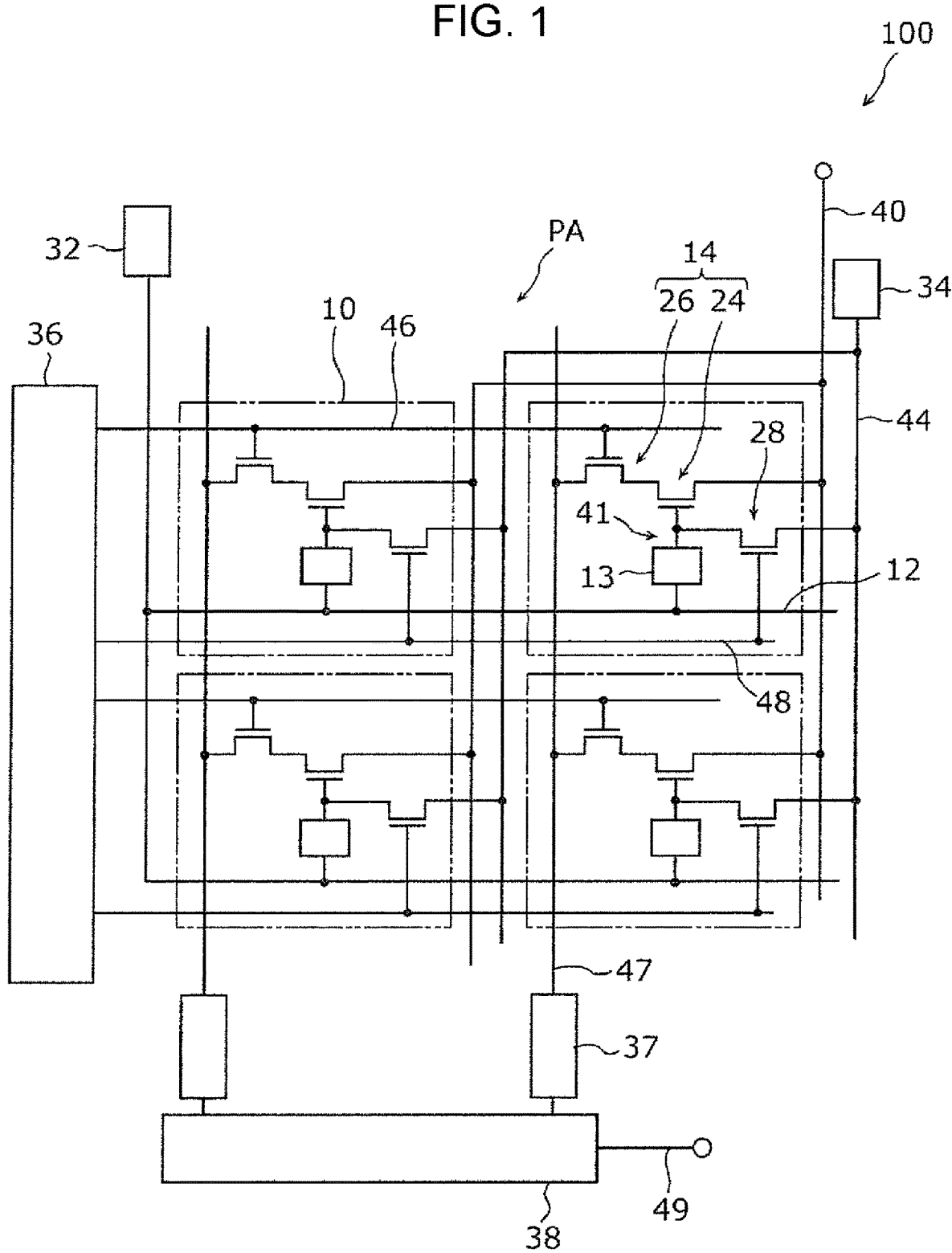
FIG. 1 is a circuit diagram of a circuit configuration of an imaging device of a first embodiment.

In laminated-type imaging devices, if electrical conductivity of a charge-blocking layer and a photoelectric conversion layer is increased to increase charge extraction speed and efficiency, the probability of charge spreading to adjacent pixels increases, and color mixing and a drop in resolution are caused, decreasing image quality. If the patterning of the photoelectric conversion layer is performed to control color mixing, the photoelectric conversion layer may be damaged, increasing a dark current created in the photoelectric conversion layer and decreasing image quality.

The disclosure may provide an imaging device that improves image quality.

Overview of the Disclosure

According an aspect of the disclosure, an imaging device includes a first pixel and a second pixel adjacent to the first pixel. Each of the first pixel and the second pixel includes a first electrode, a second electrode positioned on or above the first electrode and facing the first electrode, a photoelectric conversion layer positioned between the first electrode and the second electrode, and a first charge-blocking layer positioned between the first electrode and the photoelectric conversion layer. The first charge-blocking layer of the first pixel is separated from the first charge-blocking layer of the second pixel. The photoelectric conversion layer is disposed continuously to the first pixel and the second pixel. An area of the first charge-blocking layer of the first pixel is larger than an area of the first electrode of the first pixel in plan view.

An area of the first charge-blocking layer of the second pixel may be larger than an area of the first electrode of the second pixel in plan view.

The first charge-blocking layer that transports signal charges to the first electrode and controls the movement of charges opposite in polarity to the signal charges is separated between two adjacent pixels. For this reason, the signal charges moving into the first charge-blocking layer have difficulty in moving across the two adjacent pixels and the crossing of the signal charges between the two adjacent pixels is thus controlled. Since color mixing is controlled, image quality may thus be improved.

Since the area of the first charge-blocking layer is larger than the area of the corresponding first electrode in the pixel, the first electrode is less likely to be in contact with a photoelectric conversion layer positioned on the first charge-blocking layer. In this way, the first charge-blocking layer controlling the movement of the charges opposite in polarity to the signal charges from the first electrode to the photoelectric conversion layer may be more easily function, thereby controlling the dark current. The dark current may thus be reduced, improving image quality.

In plan view, the first electrode of the first pixel may be positioned inside the first charge-blocking layer of the first pixel.

In plan view, the first electrode of the second pixel may be positioned inside the first charge-blocking layer of the second pixel.

Since the first electrode is inside the corresponding first charge-blocking layer in the pixel, the first electrode is not in contact with the photoelectric conversion layer. The first electrode is thus isolated from the photoelectric conversion layer by the first charge-blocking layer. The movement of charges opposite in polarity to the signal charges to the photoelectric conversion layer is controlled, thus controlling the dark current.

In each of the first pixel and the second pixel, the first charge-blocking layer may be higher in electrical conductivity than the photoelectric conversion layer.

The imaging device may further include a first insulation layer positioned on or below the first charge-blocking layer of the first pixel and the first charge-blocking layer of the second pixel and include a second insulation layer positioned between the first charge-blocking layer of the first pixel and the first charge-blocking layer of the second pixel.

In this way, the second insulation layer insulates the first charge-blocking layer in the first pixel from the first charge-blocking layer in the first charge-blocking layer in the second pixel adjacent to the first pixel and the signal charges are unable to move across the two first charge-blocking layers. The movement of the signal charges between the two adjacent pixels is controlled, thus controlling color mixture.

The first insulation layer and the second insulation layer may contain the same material.

In this way, since the second insulation layer insulating one first charge-blocking layer from another is manufactured of the same material as the first insulation layer, the imaging device may be more easily manufactured.

The imaging device may further include a third electrode that is in contact with the second insulation layer and positioned in plan view between the first electrode of the first pixel and the first electrode of the second pixel.

Since the third electrode is positioned between the first pixels of the adjacent pixels, application of a voltage to the third electrode causes the signal charges moving across the two adjacent pixels to be attracted to an interface between the photoelectric conversion layer and the second insulation layer positioned on the third electrode. The crossing of the signal charges between the two adjacent pixels is controlled, controlling color mixing.

The imaging device may further include a third electrode positioned in plan view between the first electrode of the first pixel and the first electrode of the second pixel and include a second charge-blocking layer positioned between the third electrode and the photoelectric conversion layer. At least one selected from the group consisting of the first charge-blocking layer of the first pixel and the first charge-blocking layer of the second pixel is separated from the second charge-blocking layer.

Since the third electrode is disposed between the first pixels of the two adjacent pixels. The third electrode is disposed on or below the second charge-blocking layer below the photoelectric conversion layer. Application of a voltage to the third electrode collects via the second charge-blocking layer the signal charges moving across the two adjacent pixels. The crossing of the signal charges between the two adjacent pixels is controlled, controlling color mixing.

An area of the second charge-blocking layer may be larger than an area of the third electrode in plan view.

Since the area of the second charge-blocking layer is larger than the area of the third electrode positioned beneath the second charge-blocking layer, a contact area between the third electrode and the photoelectric conversion layer positioned on the second charge-blocking layer is reduced. In this way, the second charge-blocking layer controlling the movement of the charges opposite in polarity to the signal charges from the third electrode to the photoelectric conversion layer may more easily function, thereby controlling the dark current.

The second charge-blocking layer may be an electron-blocking layer.

The first charge-blocking layer controls the movement of electrons and transports holes. If the signal charges are holes, the first charge-blocking layer transports holes as signal charges to the third electrode and controls the movement of electrons opposite in polarity to the signal charges.

A portion of the photoelectric conversion layer may be positioned between the first charge-blocking layer of the first pixel and the first charge-blocking layer of the second pixel.

Since the photoelectric conversion layer is positioned between the first charge-blocking layers, the first charge-blocking layers may be formed after planarizing the top surfaces of the first electrode and the first insulation layer. For this reason, an unseparated first charge-blocking layer is formed on the top surfaces of the first electrode and the first insulation layer. First charge-blocking layers separated from each other are formed between adjacent pixels by only performing a patterning operation, such as dry etching. The first charge-blocking layers are thus free from a planarization operation after the formation thereof. The first charge-blocking layers separated between the adjacent pixels are thus easily produced.

An imaging device includes a first pixel and a second pixel adjacent to the first pixel. Each of the first pixel and the second pixel includes a first electrode, a second electrode positioned on or above the first electrode and facing the first electrode, a photoelectric conversion layer positioned between the first electrode and the second electrode, a first charge-blocking layer positioned between the first electrode and the photoelectric conversion layer. The first charge-blocking layer of the first pixel is separated from the first charge-blocking layer of the second pixel. The photoelectric conversion layer is disposed continuously to the first pixel and the second pixel. An area of the first charge-blocking layer of the first pixel is smaller than an area of the first electrode of the first pixel in plan view.

An area of the first charge-blocking layer of the second pixel may be smaller than an area of the first electrode of the second pixel in plan view.

The first charge-blocking layers transporting the signal charges to the first electrode and controlling the movement of the charges opposite in polarity to the signal charges are separated between the two adjacent pixels. In this structure, the signal charges moved in the first charge-blocking layer have difficulty in moving across the two adjacent pixels. The crossing of the signal charges between the two adjacent pixels is thus controlled. Color mixing may thus be controlled, improving image quality.

Since the area of the first charge-blocking layer is smaller than the area of the corresponding first electrode in the pixel, a distance between the first charge-blocking layer in the two adjacent pixels is longer than a distance between the first electrodes in the two adjacent pixels. Concerning the signal charges captured to the first electrodes via the first charge-blocking layer, the first electrode on one pixel has difficulty in capturing signal charges that are to be captured to the first electrode on the other pixel. Color mixing may thus be controlled, improving image quality.

The imaging device may further include a first insulation layer positioned on or below the first charge-blocking layer of the first pixel and the first charge-blocking layer of the second pixel and include a second insulation layer positioned between the first charge-blocking layer of the first pixel and the first charge-blocking layer of the second pixel.

The first charge-blocking layers in the two adjacent pixels are insulated from each other by the second insulation layer and the signal charges do not move across the two first charge-blocking layers. The movement of the signal charges between the two adjacent pixels is controlled more, restraining color mixing more.

The first charge-blocking layer may be an electron-blocking layer.

The imaging device may further include a third electrode positioned in plan view between the first electrode of the first pixel and the first electrode of the second pixel and include a second charge-blocking layer positioned between the third electrode and the photoelectric conversion layer. At least one selected from the group consisting of the first charge-blocking layer of the first pixel and the first charge-blocking layer of the second pixel is separated from the second charge-blocking layer.

The first charge-blocking layer may contain an organic substance.

A top surface of the first charge-blocking layer may be flat.

The first electrode is positioned on or below a bottom surface of the photoelectric conversion layer.

The first charge-blocking layer controls the movement of electrons and transports holes. If the signal charges are holes, the first charge-blocking layer transports holes as the signal charges to the first electrode and controls the movement of electrons serving as the charges opposite in polarity to the signal charges.

With reference to the drawings, imaging devices of embodiments of the disclosure are described. The disclosure is not limited to the following embodiments. The disclosure may be appropriately modified without departing from the scope of the disclosure. Furthermore, one embodiment may be combined with another embodiment. In the discussion that follows, the same or similar elements are designated with the same reference numerals. Duplicate explanation may be avoided.

In the specification, a term, such as equal, expressing a relationship between elements, a term, such as square or circle, expressing a shape, and a numerical range do not necessarily express a strict meaning. For example, the numerical range is intended to mean a substantially identical range and may include a difference of a few percent of the specified numerical range.

In this specification, the terms "on or above" and "on or below" do not necessarily specify an upward direction (vertically upward direction) and a downward direction (vertically downward direction) in absolute spatial recognition and are used to define relative positional relationship based on the order of lamination in a laminated structure. The terms "on or above" and "on or below" are used about elements not only when two elements are disposed in a manner mutually spaced apart from each other without any other element therebetween but also when the two elements are disposed to be in contact with each other.

First Embodiment

Circuit Configuration of Imaging Device

The circuit configuration of an imaging device 100 of a first embodiment is described below with reference to FIG. 1.

FIG. 1 is a circuit diagram of a circuit configuration of the imaging device 100 of the first embodiment. The imaging device 100 in FIG. 1 includes a pixel array PA including two-dimensionally arrayed multiple pixels 10. FIG. 1 schematically illustrates the pixels 10 arranged in a matrix of 2 rows by 2 columns. The number and arrangement of the pixels 10 in the imaging device 100 are not limited to those in FIG. 1. For example, the imaging device 100 may be a line sensor including a single row of the pixels 10.

Each pixel 10 includes a photoelectric converter 13 and a signal detector circuit 14. As described below with reference to the drawings, the photoelectric converter 13 includes a photoelectric conversion layer sandwiched between two mutually opposing electrodes and generates a signal in response to incident light. All the photoelectric converters 13 are not necessarily independent elements with one photoelectric converter 13 on a per the pixel 10 and a portion of the photoelectric converter 13 may straddle multiple pixels 10. The signal detector circuit 14 detects a signal generated by the photoelectric converter 13. In this example, the signal detector circuit 14 includes a signal detecting transistor 24 and an address transistor 26. The signal detecting transistor 24 and the address transistor 26 are typical field effect transistors (FETs). In this case, the signal detecting transistor 24 and the address transistor 26 are N-channel metal oxide semiconductor field effect transistors (MOSFETs). Each of the signal detecting transistor 24, the address transistor 26, a reset transistor 28 described below has a control terminal, an input terminal, and an output terminal. For example, the control terminal is a gate. The input terminal is one of a drain or source, and is, for example, the drain herein. The output terminal is one of the drain or source, and is, for example, the source herein.

As schematically illustrated in FIG. 1, the control terminal of the signal detecting transistor 24 is electrically connected to the photoelectric converter 13. The signal charges generated by the photoelectric converter 13 are stored in a charge accumulation node 41 between the signal detecting transistor 24 and the photoelectric converter 13. The signal charges herein are holes or electrons. The charge accumulation node 41 is an example of a charge accumulation unit and is also referred to as a "floating diffusion node." According to the disclosure, the charge accumulation node is referred to a charge accumulation region. The structure of the photoelectric converter 13 is described in detail below.

The photoelectric converter 13 in each pixel 10 is connected to a counter electrode 12. The counter electrode 12 is connected to a voltage supply circuit 32. The voltage supply circuit is also referred to as a counter electrode voltage supply circuit. The voltage supply circuit 32 is configured to supply any variable voltage. When the imaging device 100 is in operation, the voltage supply circuit 32 supplies a specific voltage to the photoelectric converter 13 via the counter electrode 12. The voltage supply circuit 32 is not limited to any particular power supply circuit and may be a circuit supplying a specific voltage or a circuit that converts a voltage supplied from another power source to a predetermined voltage.

The voltage supplied from the voltage supply circuit 32 to the photoelectric converter 13 is switched from one voltage to another among multiple different voltages, thereby controlling the start and end of accumulation of the signal charges from the photoelectric converter 13 to the charge accumulation node 41. The same control function may be implemented by controlling the voltage at the charge accumulation node 41 or the voltage at a pixel electrode described below. In other words, according to the first embodiment, an electronic shutter is operated by switching the voltage supplied from the voltage supply circuit 32 to the photoelectric converter 13 or an initial voltage at the charge accumulation node 41 or the pixel electrode. The operation of the imaging device 100 is described below. In the configuration in FIG. 1, the charge accumulation node 41 and the pixel electrode are connected to each other and thus at the same potential.

Each pixel 10 is connected to a power source line 40 that supplies a power source voltage VDD. As illustrated in FIG. 1, the power source line 40 connects to an input terminal of the signal detecting transistor 24. Since the power source line 40 operates as a source follower power source, the signal detecting transistor 24 amplifies a signal generated by the photoelectric converter 13 and outputs the amplified signal.

An output terminal of the signal detecting transistor 24 connects to an input terminal of the address transistor 26. An output terminal of the address transistor 26 is connected to one of multiple vertical signal lines 47 disposed on a per column basis of the pixel array PA. A control terminal of the address transistor 26 is connected to an address control line 46. By controlling the potential of the address control line 46, the output of the signal detecting transistor 24 is selectively read onto the corresponding vertical signal line 47.

Referring to FIG. 1, the address control line 46 is connected to a vertical scan circuit 36. The vertical scan circuit is also referred to as a "row scan circuit." By applying a specific voltage to the address control line 46, the vertical scan circuit 36 selects multiple pixels 10 on a per row basis. In this way, the signal from the selected pixel 10 is read and the charge accumulation node 41 is reset.

The vertical signal line 47 is a main signal line that transports a pixel signal from the pixel array PA to a peripheral circuit. The vertical signal line 47 is connected to a column signal processing circuit 37. The column signal processing circuit is also referred to as a "row signal accumulation circuit." The column signal processing circuit 37 performs noise suppression signal processing, such as correlative double sampling, and analog-to-digital (AD) conversion. As illustrated in FIG. 1, the column signal processing circuit 37 is arranged for each column of the pixels 10 in the pixel array PA. These column signal processing circuits 37 are connected to a horizontal signal reading circuit 38. The horizontal signal reading circuit is also referred to as a "column scan circuit." The horizontal signal reading circuit 38 successively reads signals from multiple column signal processing circuits 37 onto a horizontal common signal line 49.

Each pixel 10 includes a reset transistor 28. Like the signal detecting transistor 24 and the address transistor 26, the reset transistor 28 is an FET. Unless otherwise particularly described below, the reset transistor 28 is an N-channel MOSFET. Referring to FIG. 1, the reset transistor 28 is connected between a reset voltage line 44 supplying a reset voltage Vr and the charge accumulation node 41. A control terminal of the reset transistor 28 is connected to a reset control line 48. By controlling the potential of the reset control line 48, the reset transistor 28 resets the potential of the charge accumulation node 41 to the reset voltage Vr. In this example, the reset control line 48 is connected to the vertical scan circuit 36. By applying a specific voltage to the reset control line 48, the vertical scan circuit 36 may reset multiple pixels 10 arranged on a per row basis.

In this example, the reset voltage line 44 supplying the reset voltage Vr to the reset transistor 28 is connected to a reset voltage source 34. The reset voltage source is also referred to as a "reset voltage supply circuit." It is sufficient enough if the reset voltage source 34 is configured to be able to supply the specific reset voltage Vr to the reset voltage line 44 when the imaging device 100 is in operation. Like the voltage supply circuit 32 described above, the reset voltage source 34 is not limited to any particular power supply circuit. Each of the voltage supply circuit 32 and the reset voltage source 34 may be part of a single power supply circuit or an individual power supply circuit. One or both of the voltage supply circuit 32 and the reset voltage source 34 may be part of the vertical scan circuit 36. Alternatively, the counter electrode voltage from the voltage supply circuit 32 and/or the reset voltage Vr from the reset voltage source 34 may be supplied to each pixel 10 via the vertical scan circuit 36.

The power source voltage VDD of the signal detector circuit 14 may be used as the reset voltage Vr. In such a case, a power supply circuit (not illustrated in FIG. 1) supplying a power source voltage to each pixel 10 and the reset voltage source 34 are unified as a single circuit. Also, the power source line 40 and the reset voltage line 44 may be unified, simplifying the wiring on the pixel array PA. However, it is noted that the use of the reset voltage Vr and the power source voltage VDD of the signal detector circuit 14 different from each other provides flexible control of the imaging device 100.

Cross-Sectional Structure of Pixel

The cross-sectional structure of the pixel of the imaging device 100 of the first embodiment is described with reference to FIG. 2.

Figure 2:
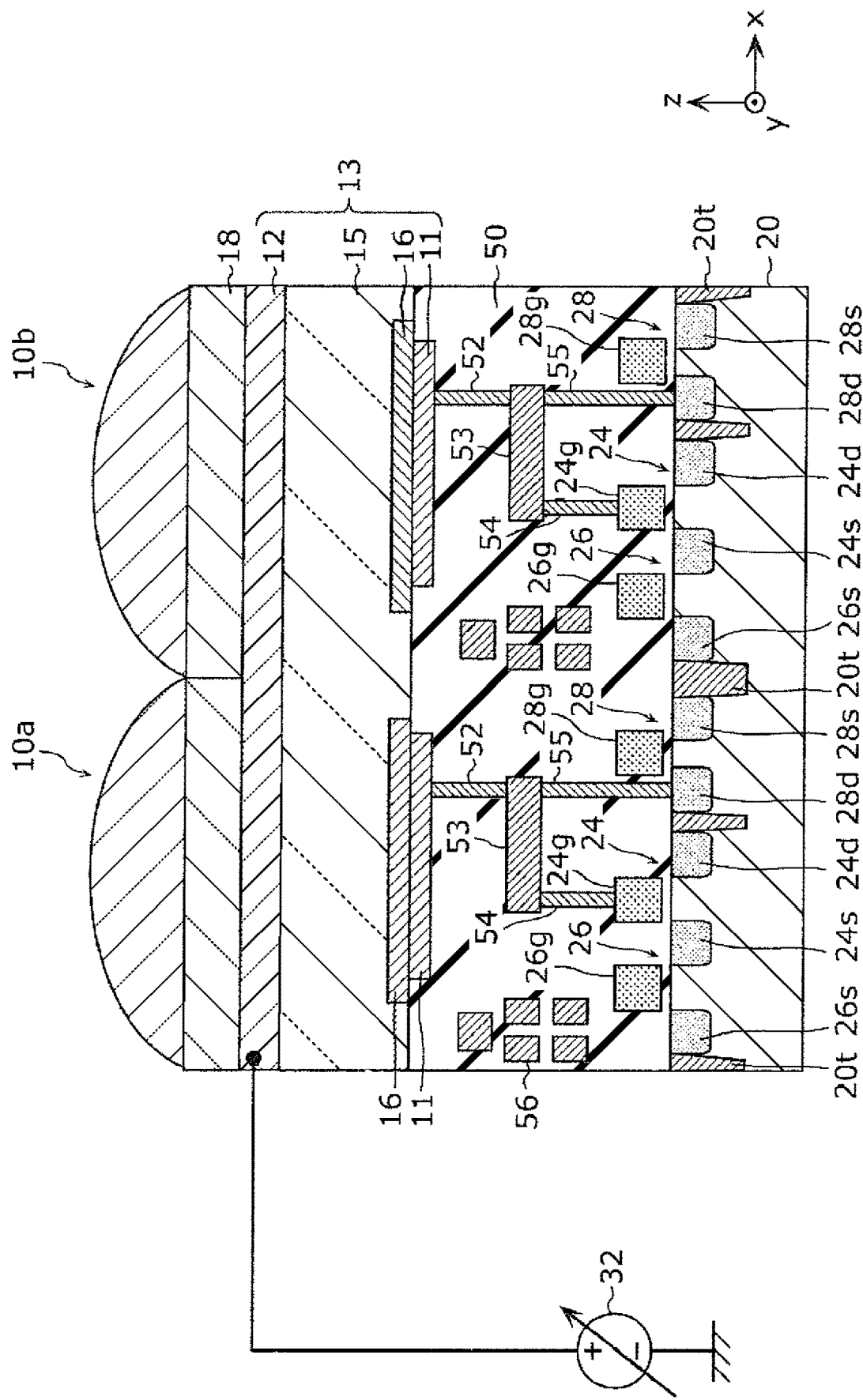
FIG. 2 is a schematic cross-sectional view illustrating a cross-sectional structure of two adjacent pixels in the imaging device of the first embodiment.

FIG. 2 is a schematic cross-sectional view illustrating a cross-sectional structure of two adjacent pixels 10a and 10b of the pixels 10 in FIG. 1. The pixels 10a and 10b adjacent to each other are examples of a first pixel and a second pixel. The pixels 10a and 10b adjacent to each other in FIG. 2 are identical to each other in structure. The pixel 10a out of the two adjacent pixels 10a and 10b is described below. It is noted that the pixels 10a and 10b adjacent to each other may be partially different from each other. In the configuration in FIG. 2, the signal detecting transistor 24, the address transistor 26, and the reset transistor 28 are formed on the semiconductor substrate 20. The semiconductor substrate 20 is not limited to a substrate that is all semiconductor. The semiconductor substrate 20 may be an insulator substrate having a semiconductor layer that is disposed on the side of the insulator substrate bearing a light-sensitive region. In this example, a P-type silicon (Si) substrate is used as the semiconductor substrate 20.

The semiconductor substrate 20 includes impurity regions 26s, 24s, 24d, 28d, and 28s, and element isolation regions 20t used to electrically isolates the pixels 10. The impurity regions 26s, 24s, 24d, 28d, and 28s are N-type regions. The element isolation region 20t is also disposed between the impurity region 24d and the impurity region 28d. The element isolation region 20t may be produced by implanting ions as acceptors under a specific condition.

The impurity regions 26s, 24s, 24d, 28d, and 28s are impurity diffusion layers formed, for example, within the semiconductor substrate 20. As schematically illustrated in FIG. 2, the signal detecting transistor 24 includes the impurity regions 24s and 24d and a gate electrode 24g. The gate electrode 24g is manufactured of an electrically conductive material. The electrically conductive material is polysilicon to which conductivity is imparted by doping it with an impurity. Alternatively, the electrically conductive material may be a metal material. The impurity regions 24s and 24d function, for example, as a source region and a drain region of the signal detecting transistor 24. The channel region of the signal detecting transistor 24 is formed between the impurity regions 24s and 24d.

Similarly, the address transistor 26 includes the impurity regions 26s and 24s and a gate electrode 26g connected to the address control line 46. The gate electrode 26g is manufactured of an electrically conductive material. The electrically conductive material is polysilicon to which conductivity is imparted by doping it with an impurity. Alternatively, the electrically conductive material may be a metal material. In this example, the signal detecting transistor 24 and the address transistor 26 are electrically connected to each other by sharing the impurity region 24s. The impurity region 24s functions, for example, as a drain region of the address transistor 26. The impurity region 26s functions, for example, as a source region of the address transistor 26. The impurity region 26s is connected to the vertical signal line 47 not illustrated in FIG. 2. The impurity region 24s may not necessarily be shared by the signal detecting transistor 24 and the address transistor 26. Specifically, the source region of the signal detecting transistor 24 is separated from the drain region of the address transistor 26 in the semiconductor substrate 20 but the source region of the signal detecting transistor 24 and the drain region of the address transistor 26 are electrically connected to each other via a wiring layer disposed within an interlayer insulation layer 50.

The reset transistor 28 includes the impurity regions 28d and 28s and a gate electrode 28g connected to the reset control line 48. The gate electrode 28g is manufactured of, for example, an electrically conductive material. The electrically conductive material is polysilicon to which conductivity is imparted by doping it with an impurity. Alternatively, the electrically conductive material may be a metal material. The impurity region 28s functions, for example, as a source region of the reset transistor 28. The impurity region 28s is connected to the reset voltage line 44 not illustrated in FIG. 2. The impurity region 28d functions, for example, as a drain region of the reset transistor 28.

The interlayer insulation layer 50 is disposed on the semiconductor substrate 20 in a manner such that the interlayer insulation layer 50 covers the signal detecting transistor 24, the address transistor 26, and the reset transistor 28. The interlayer insulation layer 50 is an example of a first insulation layer. The interlayer insulation layer 50 is manufactured of, for example, an insulator, such as silicon dioxide. As illustrated in FIG. 2, a wiring layer 56 is disposed within the interlayer insulation layer 50. The wiring layer 56 is typically manufactured of a metal, such as copper, and may partially include a signal line, such as the vertical signal line 47, or a power source line. The number of insulation layers in the interlayer insulation layer 50 and the number of layers in the wiring layer 56 disposed in the interlayer insulation layer 50 may be set to any number and are not limited to those illustrated in FIG. 2.

Referring to FIG. 2, a plug 52, a wiring 53, a contact plug 54, and a contact plug 55 are disposed within the interlayer insulation layer 50. The wiring 53 may be a portion of the wiring layer 56. Each of the plug 52, the wiring 53, the contact plug 54, and the contact plug 55 is manufactured of an electrically conductive material. For example, the plug 52 and the wiring 53 may be manufactured of a metal material, such as copper. For example, the contact plugs 54 and 55 are polysilicon to which electrical conductivity is imparted by doping it with an impurity. The plug 52, the wiring 53, the contact plug 54, and the contact plug 55 may be manufactured of the same material or mutually different materials.

The plug 52, the wiring 53, and the contact plug 54 form at least part of the charge accumulation node 41 between the signal detecting transistor 24 and the photoelectric converter 13. In the structure in FIG. 2, the gate electrode 24g of the signal detecting transistor 24, the plug 52, the wiring 53, the contact plugs 54 and 55, and the impurity region 28d serving as one of the source region or the drain region of the reset transistor 28 function as a charge accumulation region that accumulates the signal charges collected by the pixel electrode 11 of the photoelectric converter 13 positioned on the interlayer insulation layer 50. The pixel electrode 11 is an example of a first electrode.

Specifically, the pixel electrode 11 in the photoelectric converter 13 is connected to the gate electrode 24g of the signal detecting transistor 24 via the plug 52, the wiring 53, and the contact plug 54. In other words, the gate of the signal detecting transistor 24 is electrically connected to the pixel electrode 11. The pixel electrode 11 is connected to the impurity region 28d via the plug 52, the wiring 53, and the contact plug 55.

When the signal charges are captured by the pixel electrode 11, a voltage responsive to an amount of signal charges accumulated in the charge accumulation region is applied to the gate of the signal detecting transistor 24. The signal detecting transistor 24 amplifies the voltage. The voltage amplified by the signal detecting transistor 24 is selectively read as a signal voltage by the address transistor 26.

The photoelectric converter 13 is disposed on the interlayer insulation layer 50. In other words, multiple pixels 10 forming the pixel array PA in FIG. 1 are formed within and on the semiconductor substrate 20. When the semiconductor substrate 20 is viewed in plan view, the two-dimensionally arrayed pixels 10 form a light sensitive region. The light sensitive region is also referred to as a pixel region. Referring to FIG. 2, a distance between two adjacent pixels 10a and 10b, namely, a pixel pitch may be as long as about 2 μm.

The photoelectric converter 13 includes the pixel electrode 11, the counter electrode 12, a photoelectric conversion layer 15, and an electron-blocking layer 16. Specifically, each of the pixels 10 includes the pixel electrode 11, the counter electrode 12 positioned on or above and facing the pixel electrode 11, the photoelectric conversion layer 15 positioned between the pixel electrode 11 and the counter electrode 12, and the electron-blocking layer 16 positioned between the pixel electrode 11 and the photoelectric conversion layer 15. The interlayer insulation layer 50 is positioned on or below the electron-blocking layer 16.

Referring to FIG. 2, the color filter 18 may be disposed on the photoelectric converter 13. The color filter 18 is a bandpass filter that transmits light within a wavelength range of red light, green light, or blue light. The color filter 18 may be a longpass filter or a notch filter. The color filter 18 may be a filter that transmits ultraviolet light or infrared light. The color filter 18 may be a filter that is adjustable in terms of light transmittance.

Configuration of Photoelectric Converter

The photoelectric converter 13 positioned on the interlayer insulation layer 50 is specifically described.

The photoelectric converter 13 includes the pixel electrode 11, the counter electrode 12, the photoelectric conversion layer 15 disposed between the pixel electrode 11 and the counter electrode 12, and the electron-blocking layer 16 disposed between the pixel electrode 11 and the photoelectric conversion layer 15. In other words, the photoelectric converter 13 includes the pixel electrode 11, the electron-blocking layer 16 positioned on the pixel electrode 11, the counter electrode 12 facing the opposite side of the electron blocking layer 16 from the pixel electrode 11, and the photoelectric conversion layer 15 positioned between the electron-blocking layer 16 and the counter electrode 12. The electron-blocking layer 16 is an example of a first charge-blocking layer and the counter electrode 12 is an example of a second electrode. The counter electrode 12 and the photoelectric conversion layer 15 are disposed to straddle the two adjacent pixels 10a and 10b. The counter electrode 12 and the photoelectric conversion layer 15 may straddle further across another pixel 10. The pixel electrode 11 is disposed on each of the two adjacent pixels 10a and 10b. The pixel electrode 11 of the pixel 10a is spatially apart from and thus electrically isolated from the pixel electrode 11 of the pixel 10b. The pixel electrodes 11 of other pixels 10 not illustrated in FIG. 2 are separated from one pixel 10 to another pixel 10. At least one of the counter electrode 12 or the photoelectric conversion layer 15 may be separated from one pixel 10 to another pixel 10.

The pixel electrode 11 is used to read signal charges generated by the photoelectric converter 13. At least one pixel electrode 11 is present on each the pixel 10. The pixel electrode 11 is electrically connected to the gate electrode 24g of the signal detecting transistor 24 and the impurity region 28d.

The pixel electrode 11 is manufactured of an electrically conductive material. The electrically conductive material may be metal, metal nitride, or polysilicon to which electrical conductivity is imparted by doping it with an impurity. For example, the metal may be aluminum or copper.

The counter electrode 12 is a transparent electrode manufactured of a transparent conductive material. The counter electrode 12 is disposed on the light incident side of the photoelectric conversion layer 15. The photoelectric conversion layer 15 receives light transmitted through the counter electrode 12. Light to be detected by the imaging device 100 is not limited to light within a visible light wavelength range. For example, the imaging device 100 may detect ultraviolet light or infrared light. The visible light wavelength range refers to a range of 380 nm or longer to 780 nm or shorter.

The word "transparent" in the specification refers to transmission of at least part of light within a wavelength range to be detected and does not necessarily mean that light within the whole of the visible light wavelength range is transmitted. In the context of the specification, electromagnetic waves including ultraviolet light and infrared light are referred to as light for convenience.

The counter electrode 12 may be manufactured of transparent conducting oxide (TCO), such as ITO, IZO, AZO, FTO, $SnO_2$, $TiO_2$, or $ZnO_2$.

Referring to FIG. 1, the counter electrode 12 is connected to the voltage supply circuit 32. Referring to FIG. 2, the counter electrode 12 is disposed to straddle the two adjacent pixels 10a and 10b. A counter electrode voltage at a specific level is applied from the voltage supply circuit 32 to the two adjacent pixels 10a and 10b together at a time. The counter electrode 12 may be formed to straddle multiple pixels 10 not illustrated in FIG. 2. As long as the counter electrode voltage at a desired level is applied by the voltage supply circuit 32, the counter electrode 12 may be respectively segmented with one counter electrode 12 for each of the two adjacent pixels 10a and 10b and other pixels 10.

The voltage supply circuit 32 may control the potential of the counter electrode 12 with respect to the potential of the pixel electrode 11 such that either holes or electrons in hole-electron pairs caused in the photoelectric conversion layer 15 via photoelectric conversion are captured by the pixel electrode 11 as signal charges. For example, if holes are used as the signal charges, the pixel electrode 11 may selectively capture holes by setting the counter electrode 12 to be higher in potential than the pixel electrode 11. In the following discussion, the holes are used as the signal charges. The use of the electrons as the signal charges is also possible. In such a case, the counter electrode 12 is set to be lower in potential than the pixel electrode 11. With a bias voltage supplied between the pixel electrode 11 facing the counter electrode 12 and the counter electrode 12, the pixel electrode 11 may capture either positive charges or negative charges generated via photoelectric conversion of the photoelectric conversion layer 15.

The photoelectric conversion layer 15 generates hole-electron pairs in response to incident light. The photoelectric conversion layer may be an inorganic semiconductor material or an organic semiconductor material.

The material of the photoelectric conversion layer 15 may be a quantum dot material or a quantum well material, having the quantum confinement effect. The quantum dot material may be PbS quantum dot, InSb quantum dot, or Ge quantum dot.

The material of the photoelectric conversion layer 15 may be carbon nanotube having wavelength selectivity based on chiral selection. Carbon nanotube having wavelength selectivity based on chiral selection has absorption sensitivity characteristics having a sharp and narrow absorption peak not like a broad absorption peak provided by crystalline material. The carbon nanotube thus implements narrow-band wavelength imaging.

If the quantum dot material or the carbon nanotube is used for the photoelectric conversion layer and patterning is performed on the photoelectric conversion layer after being formed, the quantum dot material or the carbon nanotube is damaged. As a result, the dark current increases in an imaging device. In the imaging device of the first embodiment, damage to the photoelectric conversion layer involved in the patterning of the photoelectric conversion layer may be reduced, reducing resolution reduction and color mixing.

Unlike the complementary metal oxide semiconductor (CMOS) image sensor, in the imaging device 100 of the first embodiment with the photoelectric conversion layer 15 laminated on the circuit substrate, a material different from Si forming the circuit substrate is selected to form the photoelectric converter 13. Imaging free from the wavelength characteristics of the circuit substrate may be obtained.

The electron-blocking layer 16 has a function that controls the movement of electrons opposite in polarity to the signal charges from the adjacent pixel electrode 11 to the photoelectric conversion layer 15 while transporting to the corresponding electrode holes serving as the signal charges generated by the photoelectric conversion layer 15. In this way, the dark current is controlled. The material of the electron-blocking layer 16 is a p-type semiconductor and specifically, an inorganic semiconductor material, such as nickel oxide, copper oxide, chromium oxide, cobalt oxide, titanium oxide, or zinc oxide. The material of the electron-blocking layer 16 is not limited to these materials. The p-type semiconductor may be of an inorganic material that is produced by doping it with an impurity to metal oxide or metal nitride. Specifically, the p-type semiconductor may be a film that is produced by doping silicon oxide with phosphorus, arsenic, or antimony. The material of the electron-blocking layer 16 may be an organic semiconductor material, such as a hole transport organic compound.

The material of the electron-blocking layer 16 may be an inorganic material as described above. The use of an inorganic material for the electron-blocking layer 16 allows the electron-blocking layer 16 to be more accurately and easily patterned via photolithography. If an inorganic material is used for the electron-blocking layer 16, the inorganic material may have a higher compatibility with a CMOS process and a lower pollution risk of dust intrusion, and provide flatness by chemical mechanical polishing (CMP) after film formation. This may reduce variations in photoelectric conversion rate. A higher resolution imaging device may result.

From the standpoint of increasing a charge extraction speed and efficiency, the conductivity of the electron-blocking layer 16 with respect to the signal charges may be higher than the conductivity of the photoelectric conversion layer 15 with respect to the signal charges.

The structure of the electron-blocking layer 16 in the photoelectric converter 13 is described in detail below.

According to the first embodiment, as described above, the structure including the electron-blocking layer 16 is applicable to reduce the dark current occurring when holes as signal charges from the photoelectric conversion layer 15 are accumulated and read. Conversely, if electrons as signal charges are accumulated and read, a hole blocking layer serving as the first charge-blocking layer may be used instead of the electron-blocking layer 16. The hole blocking layer has a function of controlling the movement of holes from an adjacent pixel electrode 11 to the photoelectric conversion layer 15 and a function of transporting electrons generated in the photoelectric conversion layer 15 to the electrode. For example, the hole blocking layer is manufactured of an n-type semiconductor.

The laminated structure of the electron-blocking layer 16 of the imaging device 100 of the first embodiment is described in detail below.

Figure 3:
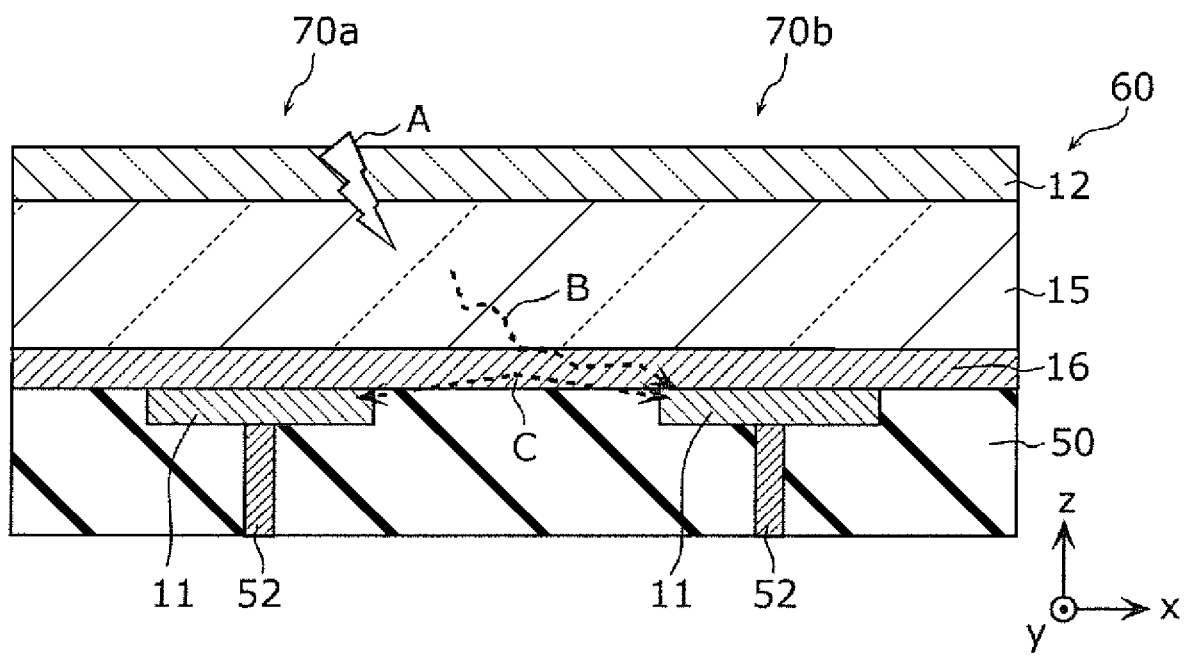
FIG. 3 is a schematic cross-sectional view illustrating a cross-sectional structure of a photoelectric converter in an imaging device of a first comparative example.

An imaging device as a first comparative example is described to describe the first embodiment. FIG. 3 is a schematic cross-sectional view illustrating a cross-sectional structure of a photoelectric converter 60 in the imaging device of the first comparative example. Referring to FIG. 3, the photoelectric converter 60 is disposed to straddle two adjacent pixels 70a and 70b. FIG. 3 also illustrates a portion of the interlayer insulation layer 50. The schematic cross-sectional view of the cross-sectional structure of each photoelectric converter described below only illustrates the photoelectric converter and a portion of the interlayer insulation layer. The structure other than the photoelectric converter is identical to the structure of the pixels 10a and 10b in FIG. 2.

Referring to FIG. 3, the two adjacent pixels 70a and 70b include the counter electrode 12, the photoelectric conversion layer 15, and the electron-blocking layer 16. The counter electrode 12, the photoelectric conversion layer 15, and the electron-blocking layer 16 are disposed to straddle the two adjacent pixels 70a and 70b. The two adjacent pixels 70a and 70b include respective pixel electrodes 11. For this reason, the signal charges that are generated by photoelectrically converting a light ray A incident on the photoelectric conversion layer 15 is likely to move from the pixel 70a to the pixel 70b within the photoelectric conversion layer 15 as denoted by an arrow mark B or move between the pixel 70a and the pixel 70b within the electron-blocking layer 16 as denoted by an arrow mark C. If signal charges originally to be captured by the pixel electrode 11 in the pixel 70a is captured by the pixel electrode 11 in the pixel 70b, color mixing may occur between the two adjacent pixels 70a and 70b. By the same mechanism, resolution may be reduced by a charge capturing range becoming larger than the pitch of the pixel electrodes 11 and a light incident angle to the imaging device 100 may be limited. These factors could lead to a problem of a narrower incident angle.

If an attempt is made to increase the electrical conductivity of the photoelectric conversion layer 15 and the electron-blocking layer 16 for the pixel electrode 11 to capture photoelectrically converted signal charges at a higher speed, the problem related to color mixing may be more pronounced.

To address the problem of color mixing, a technique of separating one photoelectric conversion layer 15 from another photoelectric conversion layer 15 may be contemplated. However, if the photoelectric conversion layer 15 is patterned, damage to the photoelectric conversion layer 15 increases the dark current and the image quality is degraded. The resulting effect may be more pronounced than when carbon nanotube having a nano structure or the quantum dot is used for the photoelectric conversion layer 15.

Figure 4:
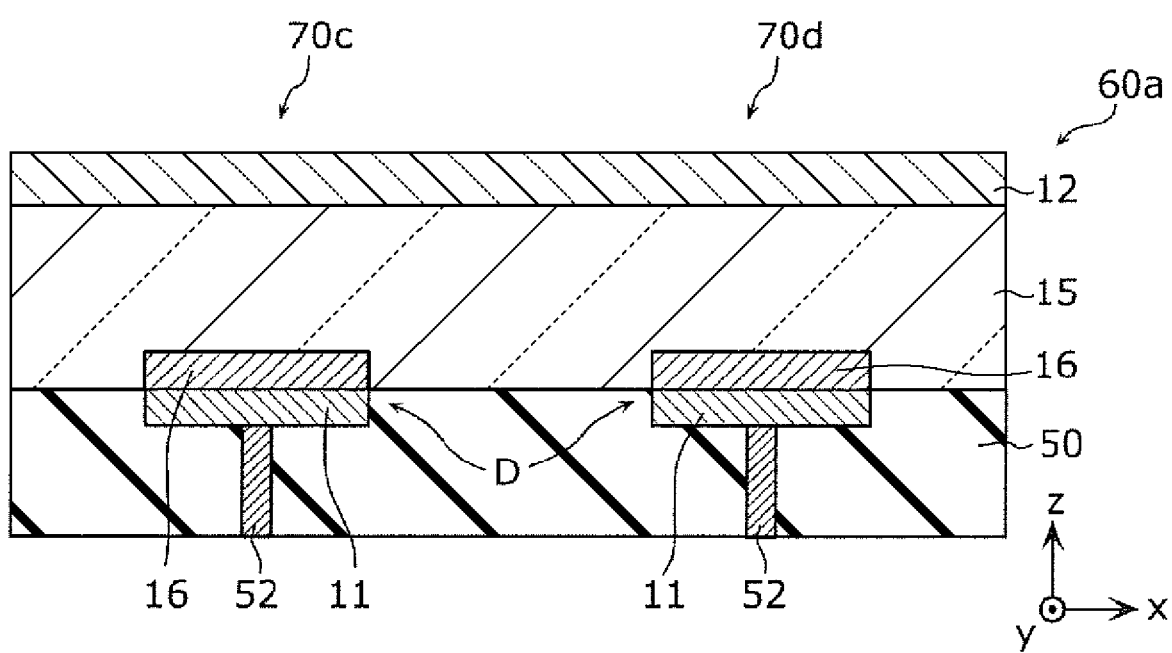
FIG. 4 is a schematic cross-sectional view illustrating a cross-sectional structure of a photoelectric converter in an imaging device of a second comparative example.

An imaging device of a second comparative example is described. FIG. 4 is a schematic cross-sectional view illustrating a cross-sectional structure of a photoelectric converter 60a in the imaging device of the second comparative example. FIG. 4 illustrates a photoelectric converter 60a disposed to straddle two adjacent pixels 70c and 70d. FIG. 4 also illustrates part of the interlayer insulation layer 50.

Referring to FIG. 4, the two adjacent pixels 70c and 70d include the counter electrode 12 and the photoelectric conversion layer 15. The counter electrode 12 and the photoelectric conversion layer 15 are disposed to straddle the two adjacent pixels 70c and 70d. Each of the two adjacent pixels 70c and 70d includes its own electron-blocking layers 16 and pixel electrodes 11. Part of the interlayer insulation layer 50 is embedded between the two separate pixel electrodes 11 and the insulating material is thus present between the two separate pixel electrodes 11. Part of the photoelectric conversion layer 15 is disposed between the two separate electron-blocking layers 16 and thus the photoelectric conversion material is present between the two separate electron-blocking layers 16.

The electron-blocking layers 16 having the function of transporting the signal charges are separated with one electron blocking layer 16 for the pixel 70c and the other electron blocking layer 16 for the pixel 70d. The signal charges moving from the photoelectric conversion layer 15 to the electron-blocking layer 16 are less likely to move between the two adjacent pixels 70c and 70d. The color mixing between the two adjacent pixels 70c and 70d may thus be controlled.

However, the imaging device of the second comparative example suffers from the following problem. Referring to FIG. 4, the sides of the electron-blocking layer 16 are positioned at the same location as the sides of the corresponding pixel electrode 11 in the pixel in plan view. The electron-blocking layer 16 is equal in area to the corresponding pixel electrode 11 in the pixel in plan view though this is not illustrated in FIG. 4 and the electron-blocking layer 16 and the pixel electrode 11 are positioned such that the outline of the electron blocking layer 16 match the outline of the pixel electrode 11 in plan view. For this reason, the electron-blocking layer 16 does not function to control the movement of electrons from the pixel electrode 11 to the photoelectric conversion layer 15 at locations D where the pixel electrode 11 is in contact with the photoelectric conversion layer 15. A dark current thus occurs there. The image quality of the imaging device may be degraded.

Figure 5:
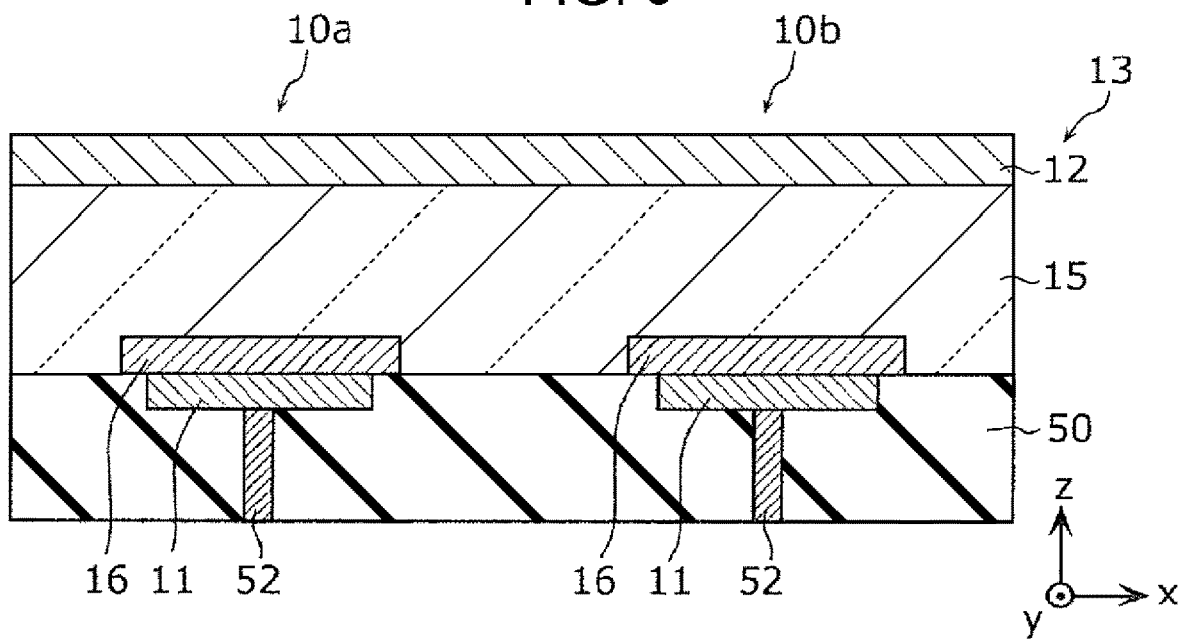
FIG. 5 is a schematic cross-sectional view illustrating a cross-sectional structure of the photoelectric converter in the imaging device of the first embodiment.
Figure 6:
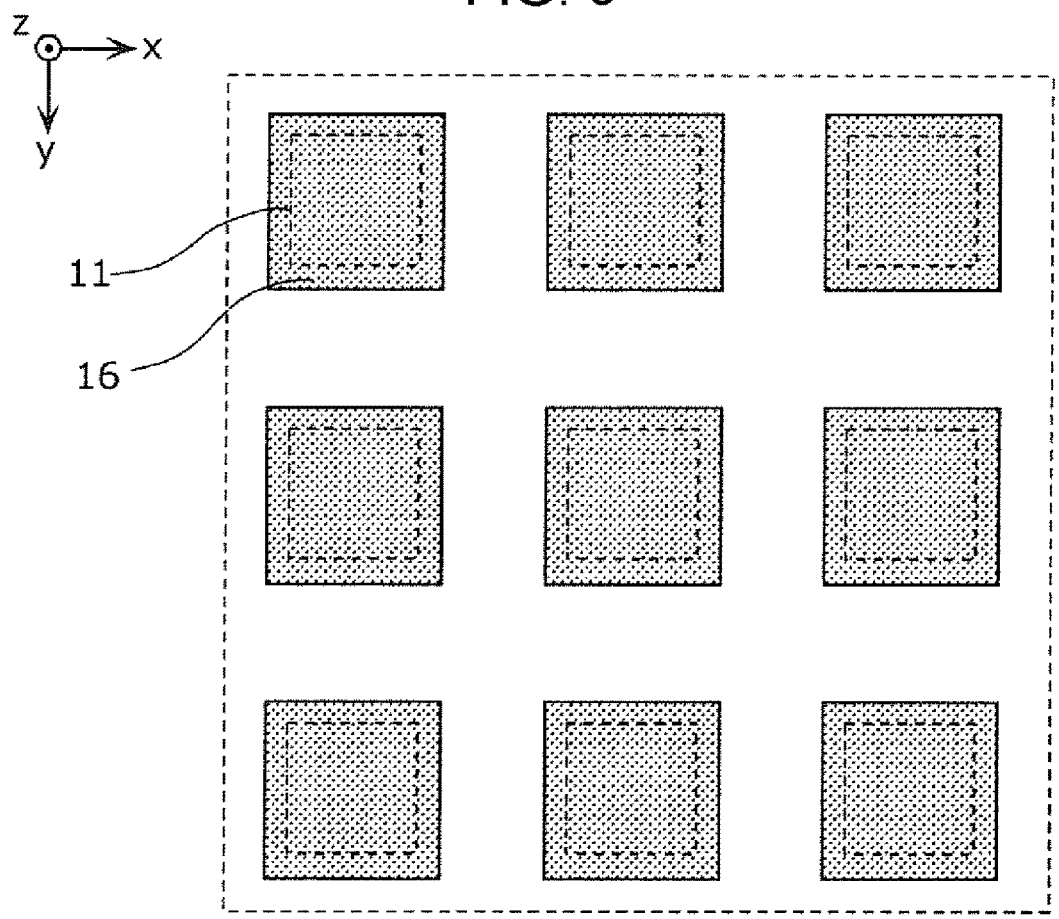
FIG. 6 is a plan view illustrating a planar layout of pixel electrodes and electron-blocking layers in the imaging device of the first embodiment.

The imaging device of the first embodiment is described with reference to FIGS. 5 and 6. FIG. 5 is a schematic cross-sectional view illustrating a cross-sectional structure of a photoelectric converter 13 in the imaging device 100 of the first embodiment. FIG. 5 illustrates the photoelectric converter 13 is disposed to straddle the two adjacent pixels 10a and 10b. The photoelectric converter 13 may be disposed to straddle other pixels (not illustrated). FIG. 5 also illustrates part of the interlayer insulation layer 50. The electron-blocking layer 16 in the photoelectric converter 13 of the first embodiment in FIG. 5 is different in area from the photoelectric converter 60a of the second comparative example in FIG. 4. FIG. 6 is a plan view illustrating a planar layout of the pixel electrodes 11 and the electron-blocking layers 16 in the imaging device 100 of the first embodiment. Referring to FIG. 6, the structure other than the pixel electrodes 11 and the electron-blocking layers 16 are not illustrated.

Referring to FIG. 5, the two adjacent pixels 10a and 10b include the counter electrode 12 and the photoelectric conversion layer 15. The counter electrode 12 and the photoelectric conversion layer 15 are disposed to straddle the two adjacent pixels 10a and 10b. It is noted that the counter electrode 12 and the photoelectric conversion layer 15 may be disposed to straddle other pixels (not illustrated).

Each of the two adjacent pixels 10a and 10b has its own electron-blocking layers 16 and pixel electrodes 11. Part of the interlayer insulation layer 50 is embedded between the two separate pixel electrodes 11 and the insulating material is thus present between the two separate pixel electrodes 11. Part of the photoelectric conversion layer 15 is disposed between the electron-blocking layer 16 of the pixel 10a and the electron-blocking layer 16 of the pixel 10b and the photoelectric conversion material is thus present between the two separate electron-blocking layers 16. Specifically, the electron-blocking layer 16 of the pixel 10a is separated from the electron-blocking layer 16 of the pixel 10b by the part of the photoelectric conversion layer 15.

Since the electron-blocking layers 16 having the function of transporting the charges are separated with one electron blocking layer 16 for the pixel 10a and the other electron blocking layer 16 for the pixel 10b. The signal charges moving from the photoelectric conversion layer 15 to the electron-blocking layer 16 are less likely to move between the two adjacent pixels 10a and 10b as denoted by the arrow mark C in FIG. 3. Color mixing between the two adjacent pixels 10a and 10b may thus be controlled.

Referring to FIG. 6, the pixel electrodes 11, each being square in plan view, are arranged in an array of rows and columns. Each electron-blocking layer 16 is also square in plan view. In plan view, the electron-blocking layer 16 is larger in area than the corresponding pixel electrode 11 in each pixel. In plan view, the outline of the pixel electrode 11 is inside the outline of the corresponding electron-blocking layer 16 in each pixel and the electron-blocking layer 16 entirely covers the pixel electrode 11. In other words, in plan view, the whole pixel electrode 11 is within the region defined by the outline of the electron-blocking layer 16. When the pixel electrode 11 is positioned within the electron-blocking layer 16, the pixel electrode 11 is arranged such that the pixel electrode 11 becomes isotropically smaller than the electron-blocking layer 16. The planar shapes of the pixel electrode 11 and the electron-blocking layer 16 are not limited to any particular shapes. For example, the pixel electrode 11 and the electron-blocking layer 16 may be circular or regular polygonal, such as regular hexagonal or regular octagonal.

In the photoelectric converter 13 of the first embodiment, different from the photoelectric converter 60a of the second comparative example in FIG. 4, the electron-blocking layer 16 is larger in area than the corresponding pixel electrode 11 in each pixel and the electron-blocking layer 16 entirely covers the top surface of the pixel electrode 11. Since the photoelectric converter 13 is without the locations D in FIG.

4 where the pixel electrode 11 is in contact with the photoelectric conversion layer 15, the electron-blocking layer 16 functions to control the movement of electrons from the pixel electrode 11 to the photoelectric conversion layer 15, controlling the dark current. Since the two adjacent electron-blocking layers 16 are separated, color mixing may be reduced. The imaging device 100 of the first embodiment may provide improved image quality.

Since part of the photoelectric conversion layer 15 is present between the electron-blocking layers 16, the electron-blocking layers 16 are formed after the interlayer insulation layer 50 and the pixel electrode 11 are planarized. An unseparated electron-blocking layer is formed on the interlayer insulation layer 50 and the pixel electrode 11 and then patterned via dry etching into the separated electron-blocking layers 16. The electron-blocking layers 16, after being formed, are free from a planarizing operation, such CMP. The easily separated electron-blocking layers 16 thus result. Also, an organic material that tends to be degraded by CMP may be used for the electron-blocking layer 16.

If a material, such as copper (Cu), having abnormal oxidation or growth characteristics, is used for a plug 52 to be connected to the pixel electrode 11, part of the material of the plug 52 having abnormally grown is exposed from the side of the pixel electrode 11, possibly causing process contamination. The electron-blocking layer 16 larger in area than the corresponding pixel electrode 11 in the pixel controls the abnormal oxidation of the material of the plug 52 and the exposure of the part of the material of the plug 52 that has abnormally grown.

Figure 7:
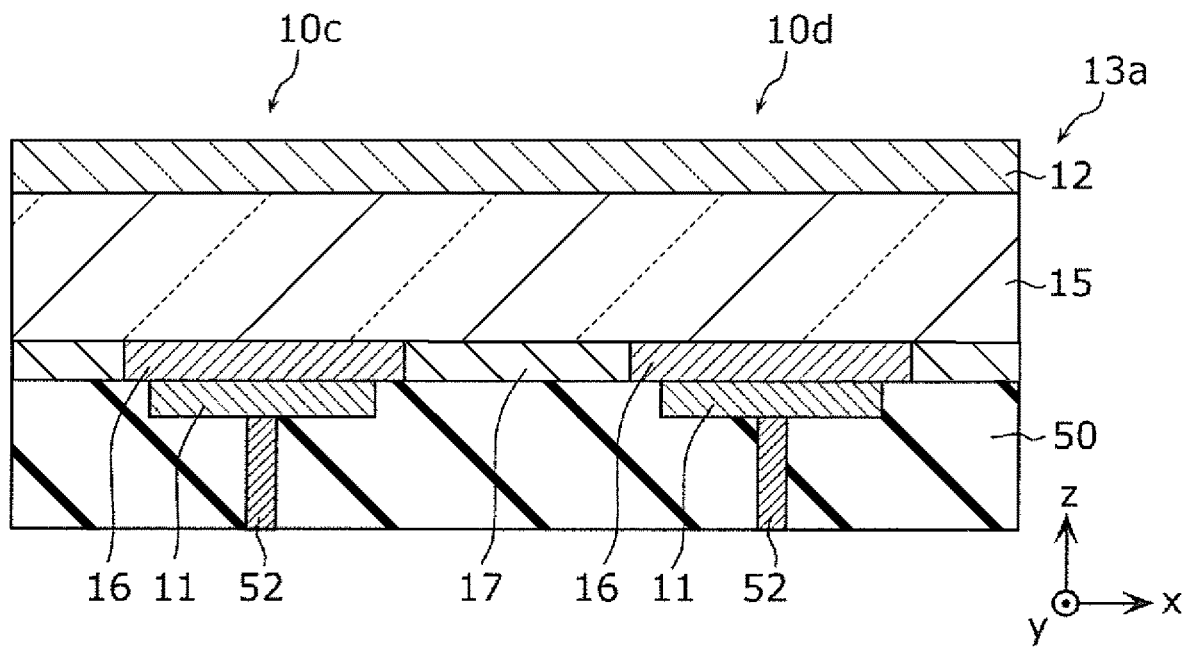
FIG. 7 is a schematic cross-sectional view illustrating a cross-sectional structure of a photoelectric converter in an imaging device of another example of the first embodiment.

An imaging device of another example of the first embodiment is described below. FIG. 7 is a schematic cross-sectional view illustrating a cross-sectional structure of a photoelectric converter 13a in the imaging device of the other example of the first embodiment. FIG. 7 illustrates the photoelectric converter 13a disposed to straddle two adjacent pixels 10c and 10d. FIG. 7 also illustrates part of the interlayer insulation layer 50.

Referring to FIG. 7, the two adjacent pixels 10c and 10d include the counter electrode 12 and the photoelectric conversion layer 15. The counter electrode 12 and the photoelectric conversion layer 15 are disposed to straddle the two adjacent pixels 10c and 10d. Each of the two adjacent pixels 10c and 10d includes its own electron-blocking layer 16 and pixel electrode 11. The photoelectric converter 13a includes a resistance layer 17 between the electron-blocking layer 16 of the pixel 10c and the electron-blocking layer 16 of the pixel 10d. In other words, the electron-blocking layer 16 of the pixel 10c is separated from the electron-blocking layer 16 of the pixel 10d by the resistance layer 17. The resistance layer 17 is disposed between the interlayer insulation layer 50 and the photoelectric conversion layer 15. The resistance layer 17 is as thick as the electron-blocking layer 16. In plan view, the electron-blocking layer 16 is larger in area than the corresponding pixel electrode 11 in each pixel.

The resistance layer 17 is lower in conductivity and higher in resistance than the photoelectric conversion layer 15 and the electron-blocking layer 16. In this way, the movement of signal charges between the electron-blocking layer 16 of the pixel 10c and the electron-blocking layer 16 of the pixel 10d is controlled. For this reason, color mixing between the two adjacent pixels 10c and 10d is controlled. Since the resistance layer 17 that is as thick as the electron-blocking layer 16 and embedded between the two electron-blocking layers 16 is present, there is almost no step on the top surfaces of the electron-blocking layer 16 and the resistance layer 17. The photoelectric conversion layer 15 that is to be laminated on the electron-blocking layer 16 and the resistance layer 17 may thus be easily planarized, controlling the occurrence of cracks in the photoelectric conversion layer 15.

The use of the resistance layer 17 provides a manufacturing method of producing the electron-blocking layers 16 in advance of embedding between the electron-blocking layers 16 the resistance layer 17 higher in electrical resistance than the electron-blocking layers 16 or a manufacturing method of patterning the resistance layer 17 in advance of embedding the electron-blocking layer 16 between the resistance layers 17. This facilitates the subsequent planarizing operation of films. For example, the electron-blocking layer 16 may be changed in material. In such a case, a physical property, such as hardness, of the electron-blocking layer 16 and the resistance layer 17 is predominant in the CMP operation for flatness. Since the imaging device with the photoelectric converter 13a includes the resistance layer 17 higher in electrical resistance than the electron-blocking layer 16, the freedom of material selection of the electron-blocking layer 16 is widened. The flatness of between the electron-blocking layer 16 and the resistance layer 17 may affect the flatness of the photoelectric conversion layer 15 that is to be formed later. The flatness of the photoelectric conversion layer 15 also affects variations of sensitivity caused by variations in the thickness of the pixels. This structure may reduce the variations of sensitivity of the imaging device.

Second Embodiment

A second embodiment of the disclosure is described below. The second embodiment is different from the first embodiment in that the second embodiment includes an interlayer insulation layer between the two electron-blocking layers. The following discussion focuses on the difference between the first embodiment and the second embodiment and points in common are only briefly described or not described at all.

Figure 8:
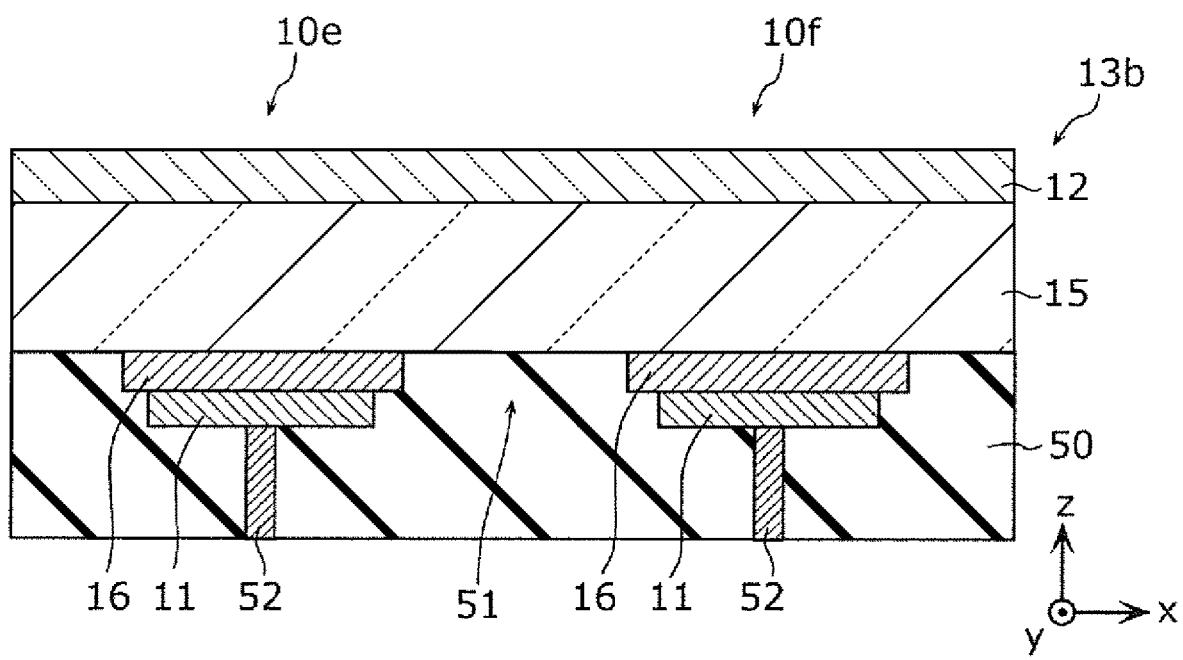
FIG. 8 is a schematic cross-sectional view illustrating a cross-sectional structure of a photoelectric converter in an imaging device of a second embodiment.

FIG. 8 is a schematic cross-sectional view illustrating a cross-sectional structure of a photoelectric converter 13b in an imaging device of the second embodiment. FIG. 8 illustrates the photoelectric converter 13b disposed to straddle two adjacent pixels 10e and 10f. FIG. 8 also illustrates part of the interlayer insulation layer 50.

Referring to FIG. 8, the two adjacent pixels 10e and 10f include the counter electrode 12 and the photoelectric conversion layer 15. The counter electrode 12 and the photoelectric conversion layer 15 are disposed to straddle the two adjacent pixels 10e and 10f. Each of the two adjacent pixels 10e and 10f has its own electron-blocking layer 16 and pixel electrode 11. The photoelectric converter 13b includes an interlayer insulation layer 51 that insulates the electron-blocking layer 16 of the pixel 10e from the electron-blocking layer 16 of the pixel 10f. The interlayer insulation layer 51 is an example of a second insulation layer. The interlayer insulation layer 51 is positioned between the electron-blocking layer 16 of the pixel 10e and the electron-blocking layer 16 of the pixel 10f. Specifically, the electron-blocking layer 16 of the pixel 10e is separated from the electron-blocking layer 16 of the pixel 10f by the interlayer insulation layer 51. The top surface of the interlayer insulation layer 51 and the top surface of the electron-blocking layer 16 form a flat surface. In plan view, the electron-blocking layer 16 is larger in area than the corresponding pixel electrode 11 in each pixel.

In the photoelectric converter 13b of the second embodiment, the electron-blocking layers 16 and the pixel electrodes 11 of the two adjacent pixels 10e and 10f are formed within the interlayer insulation layers 50 and 51. The interlayer insulation layer 51 insulates one electron-blocking layer 16 from another electron-blocking layer 16. Since signal charges are unable to move between the electron-blocking layer 16 of the pixel 10e and the electron-blocking layer 16 of the pixel 10f, the movement of the signal charges between the two adjacent pixels 10e and 10f is controlled. Color mixing may thus be reduced.

Part of the interlayer insulation layer 50 lower in electrical conductivity formed in a complementary metal oxide semiconductor (CMOS) process prior to the formation of the electron-blocking layers 16 is used for the interlayer insulation layers 51 disposed between the electron-blocking layers 16 respectively arranged for the two adjacent pixels 10e and 10f. The photoelectric converter 13b of the second embodiment may thus be produced more easily in a lower cost fashion. The material of the interlayer insulation layer 51 formed between the two electron-blocking layers 16 may or may not be the same as the material of the interlayer insulation layer 50 in which the plug 52 to be connected to the pixel electrode 11 is embedded. The interlayer insulation layer 51 may be manufactured of $SiO_2$ or a lower electrical conductivity material, such as AlO or SiN.

The electron-blocking layer 16 is embedded in the interlayer insulation layers 50 and 51 and any step between the top surface of the electron-blocking layer 16 and the top surfaces of the interlayer insulation layers 50 and 51 is reduced. The photoelectric conversion layer 15 laminated on top of these elements is more easily planarized, controlling the occurrence of cracks in the photoelectric conversion layer 15. After the electron blocking layers 16 are embedded in the interlayer insulation layers 50 and 51, a polishing process, such as the CMP process, may be easily available to reduce the step between the top surface of the electron-blocking layer 16 and the top surfaces of the interlayer insulation layers 50 and 51. The use of an inorganic material for the electron-blocking layer 16 facilitates the use of the polishing process, such as the CMP process.

Third Embodiment

A third embodiment of the disclosure is described below. The third embodiment is different from the second embodiment in that the electron-blocking layer is smaller in area than the pixel electrode in the third embodiment. The following discussion focuses on the difference between the third embodiment and each of the first and second embodiments and points in common are only briefly described or not described at all.

Figure 9:
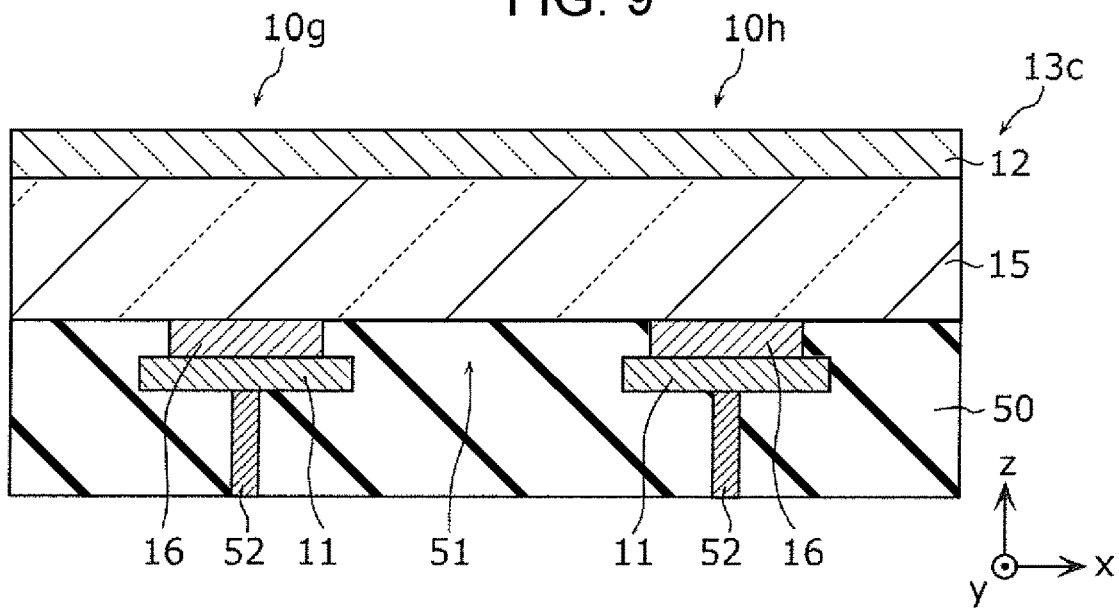
FIG. 9 is a schematic cross-sectional view illustrating a cross-sectional structure of a photoelectric converter in an imaging device of a third embodiment.
Figure 10:
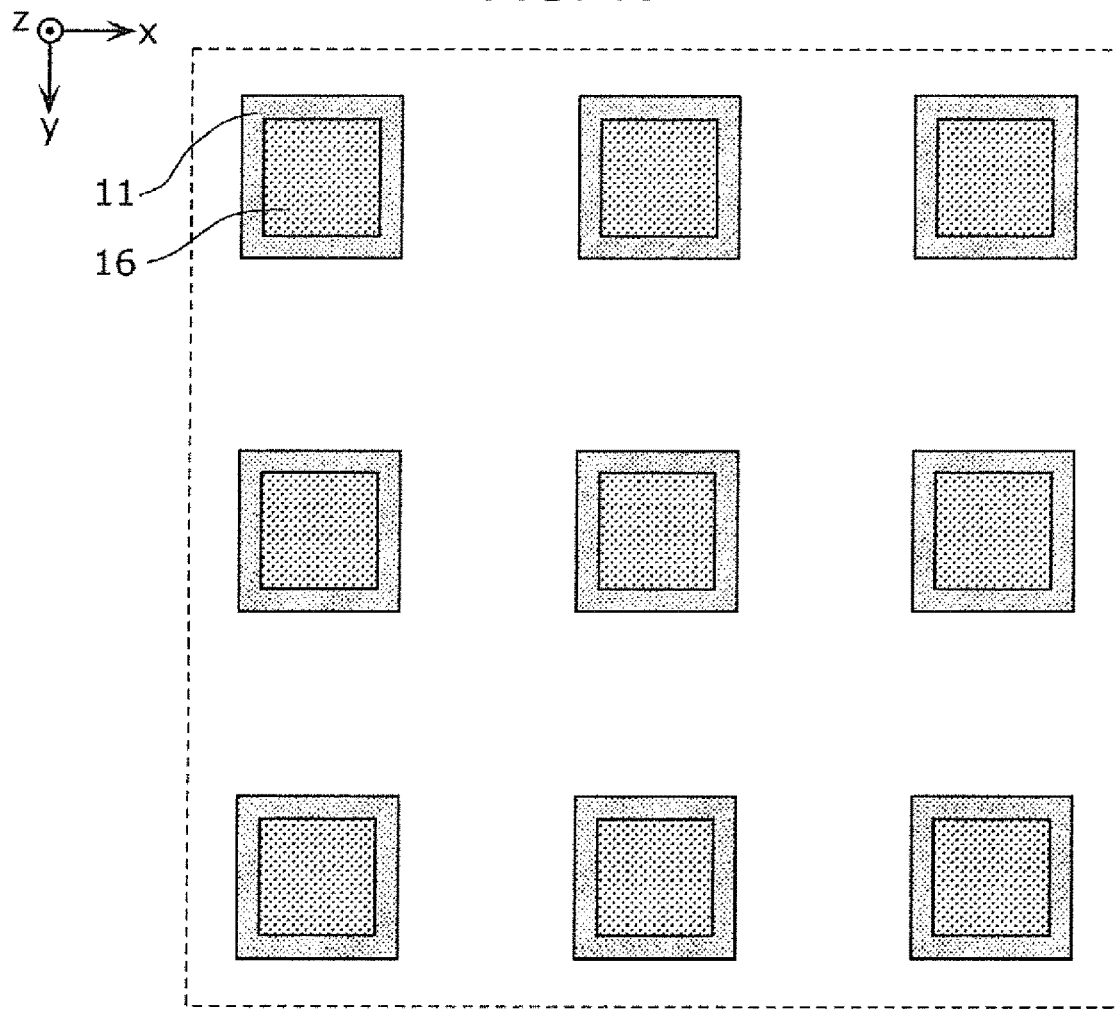
FIG. 10 is a plan view illustrating a planar layout of pixel electrodes and electron-blocking layers in the imaging device of the third embodiment.

FIG. 9 is a schematic cross-sectional view illustrating a cross-sectional structure of a photoelectric converter 13c in an imaging device of the third embodiment. FIG. 9 illustrates the photoelectric converter 13c disposed to straddle two adjacent pixels 10g and 10h. FIG. 9 illustrates part of the interlayer insulation layer 50. FIG. 10 is a plan view illustrating a planar layout of pixel electrodes 11 and electron-blocking layers 16 in the imaging device of the third embodiment. FIG. 10 does not illustrate elements other than the pixel electrodes 11 and the electron-blocking layers 16.

Referring to FIG. 9, the two adjacent pixels 10g and 10h include the counter electrode 12 and the photoelectric conversion layer 15. The counter electrode 12 and the photoelectric conversion layer 15 are disposed to straddle the two adjacent pixels 10g and 10h. Each of the two adjacent pixels 10g and 10h has its own electron-blocking layer 16 and pixel electrode 11. The photoelectric converter 13c includes the interlayer insulation layer 51 that insulates the electron-blocking layer 16 of the pixel 10g from the electron-blocking layer 16 of the pixel 10h. The interlayer insulation layer 51 is positioned between the electron-blocking layer 16 of the pixel 10g and the electron-blocking layer 16 of the pixel 10h. Specifically, the electron-blocking layer 16 of the pixel 10g is separated from the electron-blocking layer 16 of the pixel 10h by the interlayer insulation layer 51. The top surface of the interlayer insulation layer 51 and the top surfaces of the electron-blocking layers 16 form a flat surface. The interlayer insulation layer 51 is also disposed in a region where the electron-blocking layer 16 is not present between the pixel electrode 11 and the photoelectric conversion layer 15.

Referring to FIG. 10, in plan view, the electron-blocking layer 16 is smaller in area than the corresponding pixel electrode 11 in each pixel. In plan view, the outline of the pixel electrode 11 is outside the outline of the corresponding electron-blocking layer 16 in each pixel and the pixel electrode 11 is present outside of all the sides of the electron-blocking layer 16.

In the photoelectric converter 13c of the third embodiment, in plan view, the electron-blocking layer 16 is smaller in area than the corresponding pixel electrode 11 in each pixel. The signal charges generated in the photoelectric conversion layer 15 more easily move in the electron-blocking layer 16 than in the interlayer insulation layer 51. Specifically, signal charges to be captured by the pixel electrode 11 passes through the electron-blocking layer 16 in the corresponding pixel and then move to the pixel electrode 11. Since the electron-blocking layer 16 is smaller in area than the corresponding pixel electrode 11 in each pixel in plan view, charges to be captured by the pixel electrode 11 of the pixel 10g are spaced apart from the electron-blocking layer 16 of the pixel 10h adjacent to the pixel 10g. The charges to be captured by the pixel electrode 11 of the pixel 10g are less likely to be captured by the pixel electrode 11 of the pixel 10h. Color mixing between the two adjacent pixels 10g and 10h may thus be controlled.

Fourth Embodiment

A fourth embodiment of the disclosure is described below. The fourth embodiment is different from the first embodiment in that the fourth embodiment includes a shield electrode disposed between two pixel electrodes and an electron-blocking layer on the shield electrode. The following discussion focuses on the difference between the fourth embodiment and each of the first through third embodiments and points in common are briefly described or not described at all.

Figure 11:
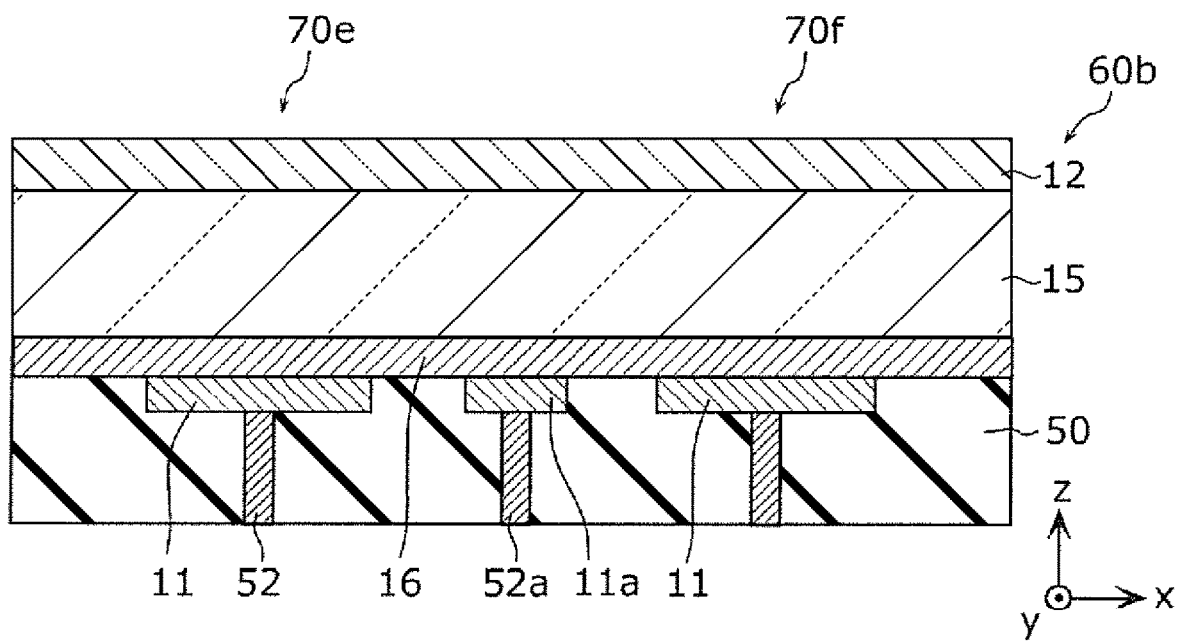
FIG. 11 is a schematic cross-sectional view illustrating a cross-sectional structure of a photoelectric converter in an imaging device of a third comparative example.

An imaging device of a third comparative example is described before the discussion of the fourth embodiment. FIG. 11 is a schematic cross-sectional view illustrating a cross-sectional structure of a photoelectric converter 60b in an imaging device of the third comparative example. FIG. 11 illustrates the photoelectric converter 60b disposed to straddle two adjacent pixels 70e and 70f. FIG. 11 also illustrates part of the interlayer insulation layer 50.

Referring to FIG. 11, the two adjacent pixels 70e and 70f include the counter electrode 12, the photoelectric conversion layer 15, and the electron blocking layer 16. The counter electrode 12, the photoelectric conversion layer 15, and the electron-blocking layer 16 are disposed to straddle the two adjacent pixels 70e and 70f. Each of the two adjacent pixels 70*e* and 70*f* has its own pixel electrode 11. The photoelectric converter 60*b* includes a shield electrode 11*a* between the pixel electrode 11 of the pixel 70*e* and the pixel electrode 11 of the pixel 70*f*. The shield electrode 11*a* is laminated between the interlayer insulation layer 50 and the electron-blocking layer 16. The shield electrode 11*a* is an example of a third electrode.

The shield electrode 11*a* is electrically connected to the semiconductor substrate 20 via a plug 52*a* and supplies a fixed voltage. The shield electrode 11*a* is different from the pixel electrode 11 in terms of applied voltage, area, and corrected circuit. The shield electrode 11*a* is manufactured of an electrically conductive material. The electrically conductive material may be a metal, such as aluminum or copper, metal nitride, or polysilicon to which conductivity is imparted by doping it with an impurity.

The shield electrode 11*a* is positioned between the pixel electrodes 11 of the two adjacent pixels 70*e* and 70*f* and is supplied with the fixed potential. The shield electrode 11*a* may thus capture the signal charges generated in the photoelectric conversion layer 15 when the signal charges move across the two adjacent pixels 70*e* and 70*f*. The use of the shield electrode 11*a* may thus control color mixing.

The photoelectric converter 60*b* includes the electron-blocking layer 16 that is disposed to straddle the two adjacent pixels 70*e* and 70*f* and the two pixel electrodes 11 and the shield electrode 11*a* are in contact with the same electron-blocking layer 16. For this reason, the shield electrode 11*a* not only may capture signal charges via the electron-blocking layer 16 on the shield electrode 11*a* from the photoelectric conversion layer 15. The shield electrode 11*a* may also capture signal charges that have moved through a portion of the electron-blocking layer 16 not on the shield electrode 11*a* and have reached a portion of the electron-blocking layer 16 right on the shield electrode 11*a*. If an amount of photoelectrically converted signal charges increases, there is a possibility that an excessive current flows to the shield electrode 11*a* and damages the photoelectric converter 60*b*.

Figure 12:
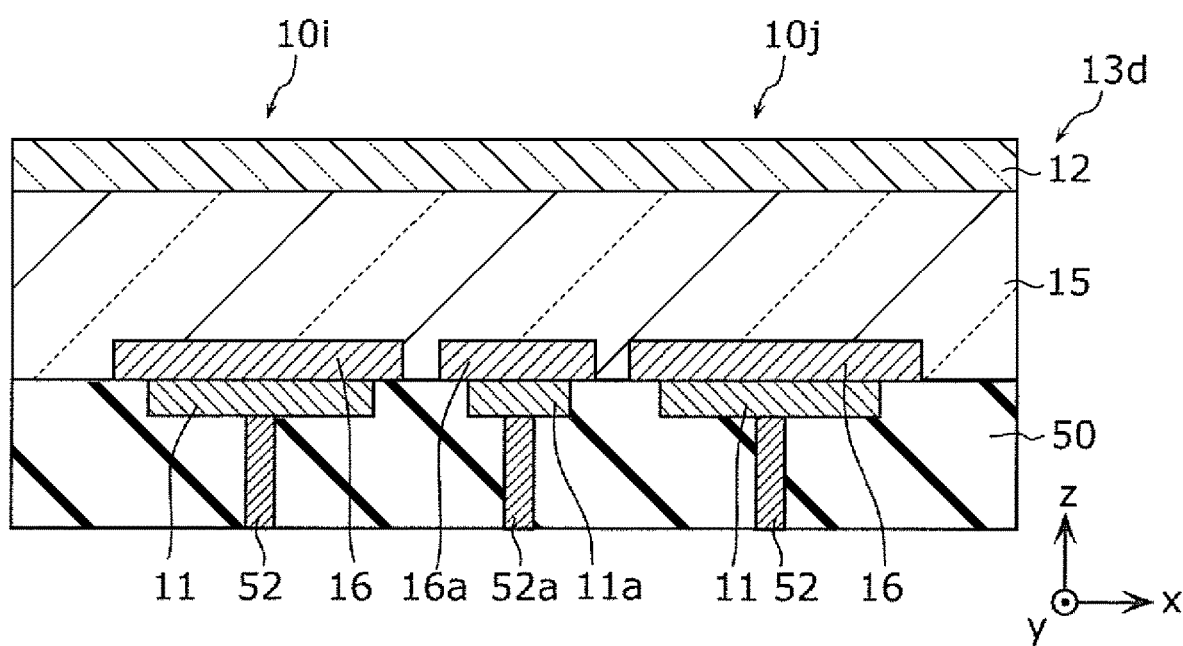
FIG. 12 is a schematic cross-sectional view illustrating a cross-sectional structure of a photoelectric converter in an imaging device of a fourth embodiment.
Figure 13:
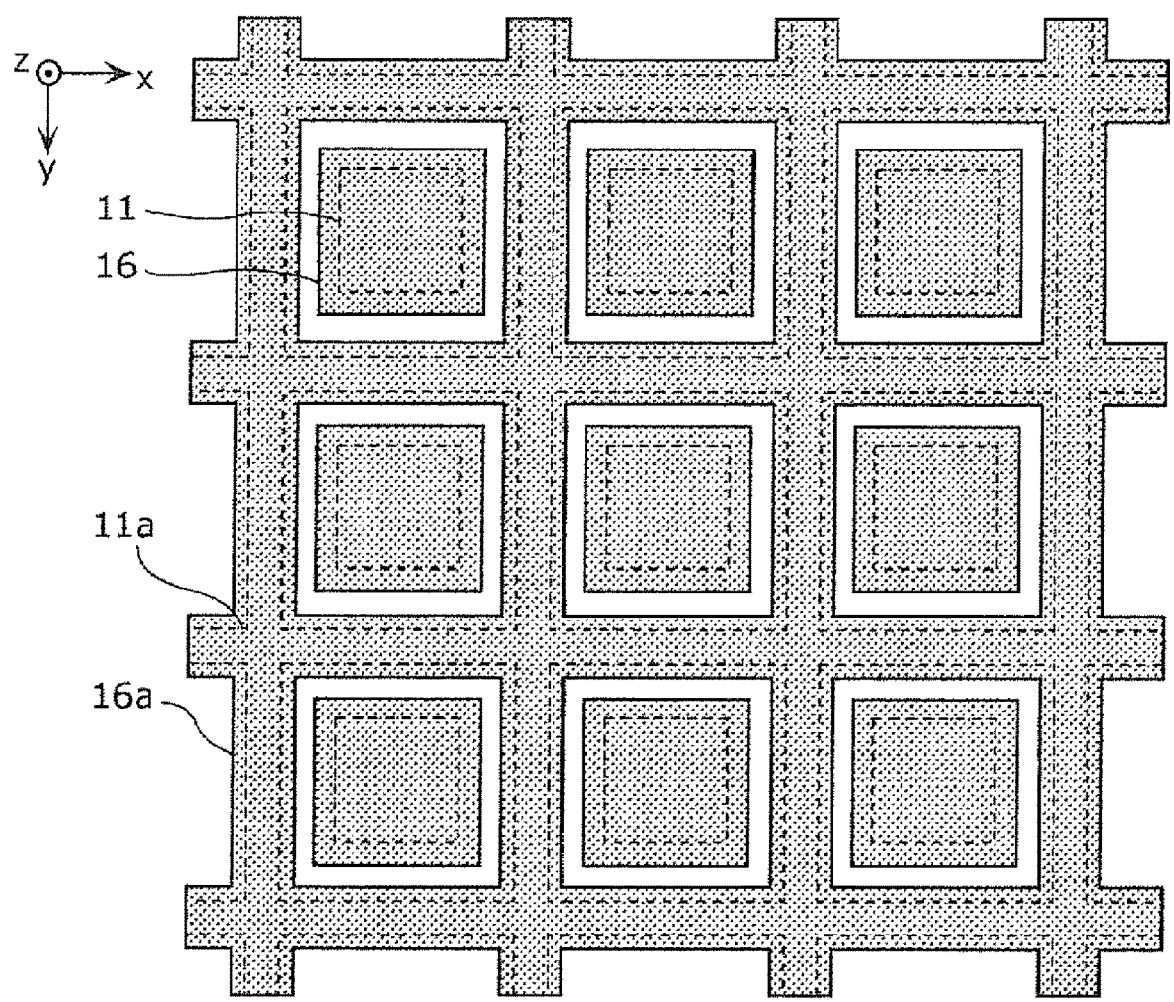
FIG. 13 is a plan view illustrating a planar layout of pixel electrodes and electron-blocking layers in the imaging device of the fourth embodiment.

The imaging device of the fourth embodiment is described with reference to FIGS. 12 and 13. FIG. 12 is a schematic cross-sectional view illustrating a cross-sectional structure of a photoelectric converter 13*d* in the imaging device of the fourth embodiment. FIG. 12 illustrates the photoelectric converter 13*d* disposed to straddle two adjacent pixels 10*i* and 10*j*. FIG. 12 also illustrates part of the interlayer insulation layer 50. FIG. 13 is a plan view illustrating a planar layout of pixel electrodes 11, shield electrode 11*a*, electron-blocking layers 16, and electron-blocking layer 16*a*. Elements other than the pixel electrodes 11, the shield electrode 11*a*, the electron-blocking layers 16, and the electron-blocking layer 16*a* are not illustrated in FIG. 13.

Referring to FIG. 12, the two adjacent pixels 10*i* and 10*j* include the counter electrode 12 and the photoelectric conversion layer 15. The counter electrode 12, and the photoelectric conversion layer 15 are disposed to straddle the two adjacent pixels 10*i* and 10*j*. Each of the two adjacent pixels 10*i* and 10*j* has its own electron-blocking layer 16 and pixel electrode 11. The photoelectric converter 13*d* includes a shield electrode 11*a* between the pixel electrode 11 of the pixel 10*i* and the pixel electrode 11 of the pixel 10*j*. The shield electrode 11*a* is laminated on the interlayer insulation layer 50 and the electron-blocking layer 16*a* is laminated on the shield electrode 11*a*. Specifically, the electron-blocking layer 16*a* is positioned between the shield electrode 11*a* and the photoelectric conversion layer 15. Part of the photoelectric conversion layer 15 is positioned between the electron-blocking layer 16 of the pixel 10*i* and the electron-blocking layer 16*a* on the shield electrode 11*a* and between the electron-blocking layer 16 of the pixel 10*j* and the electron-blocking layer 16*a* on the shield electrode 11*a*. Specifically, the electron-blocking layer 16 of the pixel 10*i* is separated from the electron-blocking layer 16*a* on the shield electrode 11*a* by part of the interlayer insulation layer 50 and the electron-blocking layer 16 of the pixel 10*j* is separated from the electron-blocking layer 16*a* on the shield electrode 11*a* by part of the photoelectric conversion layer 15. The electron-blocking layer 16*a* is an example of a second charge-blocking layer.

The shield electrode 11*a* is able to capture signal charges that move across the two adjacent pixels 10*i* and 10*j* and thus controls color mixing. Unlike the photoelectric converter 60*b* of the third comparative example in FIG. 11, the photoelectric converter 13*d* of the fourth embodiment includes the electron-blocking layer 16*a* on the shield electrode 11*a* that is separated from each of the electron-blocking layer 16 of the pixel 10*i* and the electron-blocking layer 16 of the pixel 10*j*. Signal charges having moved from the photoelectric conversion layer 15 into the electron-blocking layer 16 of the pixel 10*i* or the electron-blocking layer 16 of the pixel 10*j* are less likely to move to the electron-blocking layer 16*a* on the shield electrode 11*a*. Even if an amount of signal charges responsive to photoelectric conversion increases, an excessive current is less likely to flow to the shield electrode 11*a* and the photoelectric converter 13*d* is less likely to be damaged.

The photoelectric converter 13*d* is structured in a manner such that the electron-blocking layers 16 and 16*a* are embedded in the photoelectric conversion layer 15. A manufacturing method of forming a layer on or above the pixel electrode 11 after forming the pixel electrodes 11 and the shield electrode 11*a* via the CMOS semiconductor process is appropriate. For example, an electron-blocking layer is formed on top surfaces of the planarized pixel electrode 11, the shield electrode 11*a*, and the interlayer insulation layer 50 after they are planarized. After the electron-blocking layer is patterned, the photoelectric conversion layer 15 is formed. Since layers on or above the electron-blocking layers 16 may be formed after planarizing the top surfaces of the pixel electrode 11, the shield electrode 11*a*, and the interlayer insulation layer 50, in-plane uniformity in photoelectric conversion characteristics may thus be increased. Since an organic material, if used for the electron-blocking layers 16 and 16*a*, is different in solubility from a photoresist used in patterning, the patterning operation may be more easily performed.

Referring to FIG. 13, multiple pixel electrodes 11 in square shape in plan view are arranged in an array of rows and columns. The electron-blocking layers 16 are also square in plan view. The shield electrode 11*a* in a lattice structure is disposed between adjacent pixel electrodes 11 in a manner such that the shield electrode 11*a* is not in contact with the pixel electrodes 11 and the electron-blocking layers 16. The electron-blocking layer 16*a* on the shield electrode 11*a* is also in a lattice structure and disposed between adjacent pixel electrodes 11 in a manner such that the electron-blocking layer 16*a* is not in contact with the pixel electrodes 11 and the electron-blocking layers 16.

In plan view, the electron-blocking layer 16 is larger in area than the corresponding pixel electrode 11 in each pixel. In plan view, the outline of the pixel electrode 11 is inside the outline of the corresponding electron-blocking layer 16 in each pixel and the electron-blocking layer 16 entirely covers the top surface of the corresponding pixel electrode 11. In plan view, the electron-blocking layer 16a is larger in area than the shield electrode 11a that is disposed beneath the electron-blocking layer 16a. In plan view, the outline of the shield electrode 11a is inside the outline of the electron-blocking layer 16a disposed on the shield electrode 11a and the electron-blocking layer 16a entirely covers the top surface of the shield electrode 11a. In this way, the shield electrode 11a in the lattice shape is disposed between the adjacent pixel electrodes 11 without gaps and are easily supplied with a potential.

The pixel electrodes 11, the shield electrode 11a, the electron-blocking layers 16, and the electron-blocking layer 16a are not limited to any particular shapes. For example, the pixel electrodes 11 and the electron-blocking layers 16 may be circular or regular polygonal, such as regular hexagonal or regular octagonal. In such a case, the shield electrode 11a and the electron-blocking layer 16a may be a sheet having an array of rows and columns of circular openings or regular hexagonal openings.

In this way, the electron-blocking layer 16 is larger in area than the corresponding pixel electrode 11 in each pixel and entirely covers the top surface of the pixel electrode 11. The electron-blocking layer 16a is larger in area than the shield electrode 11a beneath the electron-blocking layer 16a and entirely covers the top surface of the shield electrode 11a. In this way, the pixel electrodes 11 and the shield electrode 11a are not in contact with the photoelectric conversion layer 15. The electron-blocking layers 16 and 16a controlling the movement of electrons from the pixel electrodes 11 and the shield electrode 11a to the photoelectric conversion layer 15 thus function, controlling the dark current.

Fifth Embodiment

A fifth embodiment is described below. The fifth embodiment is different from the second embodiment in that the fifth embodiment incudes a shield electrode disposed between two pixel electrodes and an electron-blocking layer disposed on the shield electrode. The following discussion focuses on the difference between the fifth embodiment and each of the first through fourth embodiments and points in common are only briefly described or not described at all.

Figure 14:
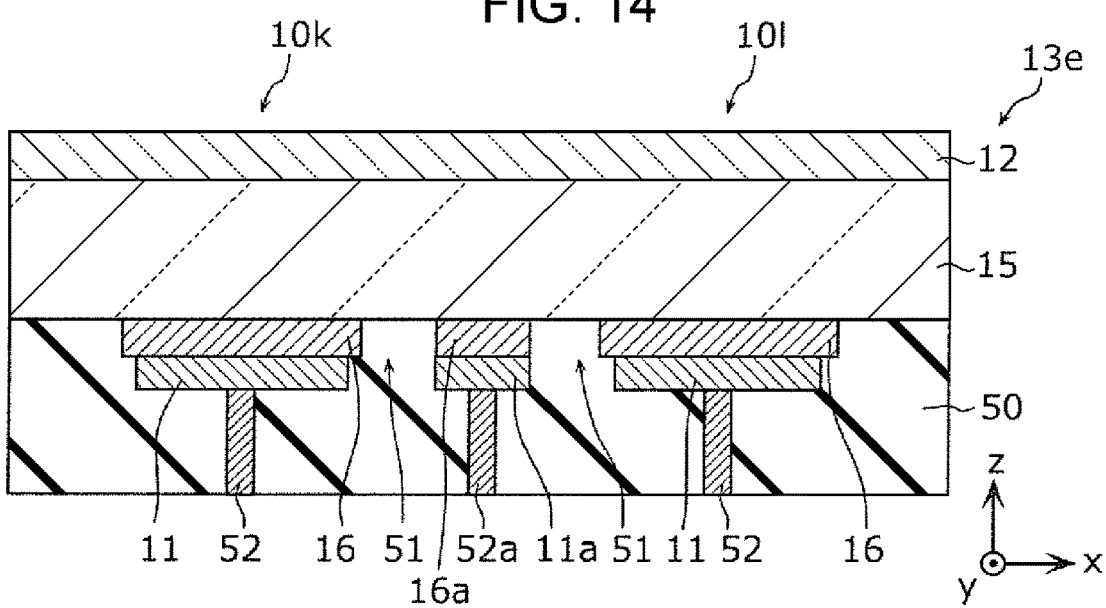
FIG. 14 is a schematic cross-sectional view illustrating a cross-sectional structure of a photoelectric converter in an imaging device of a fifth embodiment.

FIG. 14 is a schematic cross-sectional view illustrating a cross-sectional structure of a photoelectric converter 13e in an imaging device of the fifth embodiment. FIG. 14 displays the photoelectric converter 13e disposed to straddle two adjacent pixels 10k and 10l. FIG. 14 also illustrates part of the interlayer insulation layer 50.

Referring to FIG. 14, the two adjacent pixels 10k and 10l include the counter electrode 12 and the photoelectric conversion layer 15. The counter electrode 12 and the photoelectric conversion layer 15 are disposed to straddle the two adjacent pixels 10k and 10l. Each of the two adjacent pixels 10k and 10l has its own electron-blocking layer 16 and pixel electrode 11. The photoelectric converter 13e includes the shield electrode 11a between the pixel electrode 11 of the pixel 10k and the pixel electrode 11 of the pixel 10l. The shield electrode 11a is laminated on the interlayer insulation layer 50 and the electron-blocking layer 16a is laminated on the pixel electrode 11. The electron-blocking layer 16a is positioned between the shield electrode 11a and the photoelectric conversion layer 15. The photoelectric converter 13e also include the interlayer insulation layer 51 that insulates the electron-blocking layer 16 from the electron-blocking layer 16a. The interlayer insulation layer 51 is positioned between the electron-blocking layer 16 of the pixel 10k and the electron-blocking layer 16a and between the electron-blocking layer 16 of the pixel 10l and the electron-blocking layer 16a. In other words, the electron-blocking layers 16 and the electron-blocking layer 16a are separated from each other by the interlayer insulation layer 51. The top surface of the interlayer insulation layer 51, the top surfaces of the electron-blocking layers 16 and the top surface of the electron-blocking layer 16a form a flat surface. In plan view, the electron-blocking layer 16 is larger than the corresponding pixel electrode 11 in each pixel and the electron-blocking layer 16a is equal in area to the shield electrode 11a.

Since the photoelectric converter 13e includes the shield electrode 11a, the shield electrode 11a captures signal charges moving across the two adjacent pixels 10k and 10l. Color mixing may thus be controlled. Since the electron-blocking layer 16 is insulated from the electron-blocking layer 16a by the interlayer insulation layer 51, signal charges are unable to move between the electron-blocking layer 16 and the electron-blocking layer 16a. Even if an amount of photoelectrically converted signal charges increases, an excessive current is less likely to flow to the shield electrode 11a and the photoelectric converter 13e is less likely to be damaged.

Sixth Embodiment

A sixth embodiment is described below. The sixth embodiment is different from the second embodiment in that the six embodiment includes a shield electrode between two pixel electrodes. The following discussion focuses on the difference between the sixth embodiment and each of the first through fifth embodiments and points in common are only briefly described or not described at all.

Figure 15:
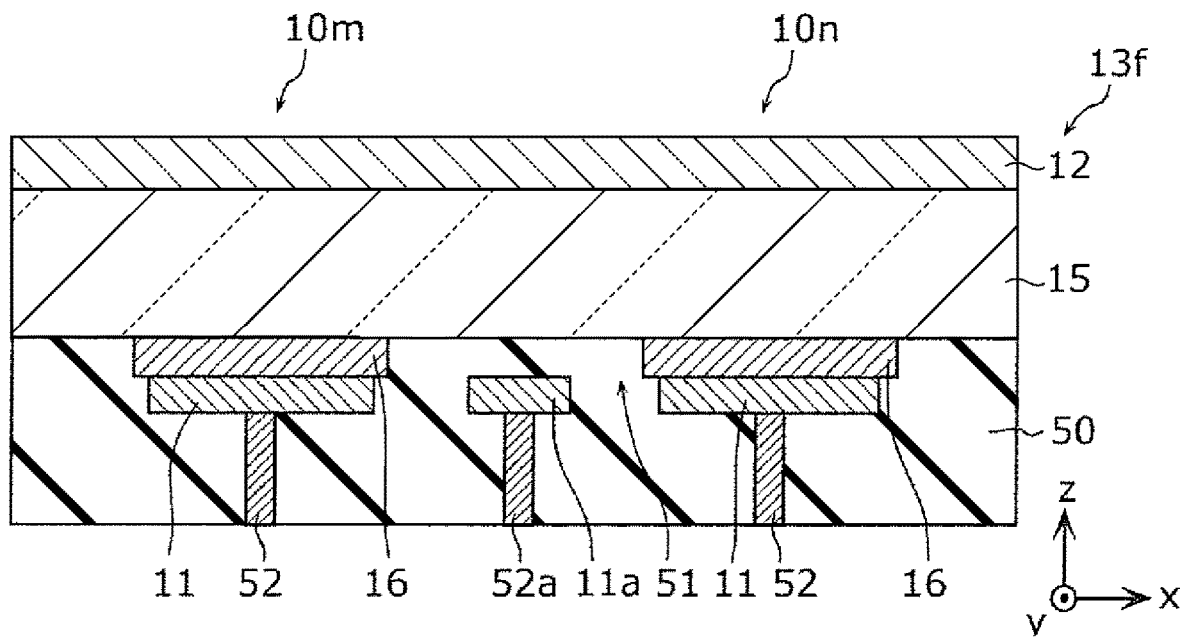
FIG. 15 is a schematic cross-sectional view illustrating a cross-sectional structure of a photoelectric converter in an imaging device of a sixth embodiment.

FIG. 15 is a schematic cross-sectional view illustrating a cross-sectional structure of a photoelectric converter 13f in an imaging device of the sixth embodiment. FIG. 15 illustrates the photoelectric converter 13f disposed to straddle two adjacent pixels 10m and 10n. FIG. 15 also illustrates part of the interlayer insulation layer 50.

Referring to FIG. 15, the two adjacent pixels 10m and 10n include the counter electrode 12 and the photoelectric conversion layer 15. The counter electrode 12 and the photoelectric conversion layer 15 are disposed to straddle the two adjacent pixels 10m and 10n. Each of the two adjacent pixels 10m and 10n has its own electron-blocking layer 16 and pixel electrode 11. The photoelectric converter 13f includes the interlayer insulation layer 51 that insulates the electron-blocking layer 16 of the pixel 10m from the electron-blocking layer 16 of the pixel 10n. The electron-blocking layer 16 of the pixel 10m is separated from the electron-blocking layer 16 of the pixel 10n by the interlayer insulation layer 51. The photoelectric converter 13f also includes the shield electrode 11a between the pixel electrode 11 of the pixel 10m and the pixel electrode 11 of the pixel 10n. The shield electrode 11a is disposed within the interlayer insulation layer 50 and the top surface of the shield electrode 11a is in contact with the interlayer insulation layer 51. Specifically, the photoelectric conversion layer 15 is insulated from the shield electrode 11a by the interlayer insulation layer 51. The top surface of the interlayer insulation layer 51 and the top surfaces of the electron-blocking layer 16 form a flat surface. In plan view, the electron-blocking layer 16 is larger in area than the corresponding pixel electrode 11 in each pixel.

In this way, the shield electrode 11a is disposed between the pixel electrodes 11 of the two adjacent pixels 10m and 10*n*. With the shield electrode 11*a* supplied with a voltage, signal charges moving across the two adjacent pixels 10*m* and 10*n* are drawn into the interface between the photoelectric conversion layer 15 and the interlayer insulation layer 51 positioned on the shield electrode 11*a*. Color mixing may thus be reduced. Since the shield electrode 11*a* is insulated from the photoelectric conversion layer 15 by the interlayer insulation layer 51, the capturing of signal charged by the shield electrode 11*a* is controlled. Even if an amount of photoelectrically converted signal charges increases, an excessive current is less likely to flow to the shield electrode 11*a* and the photoelectric converter 13*f* is less likely to be damaged.

Figure 16:
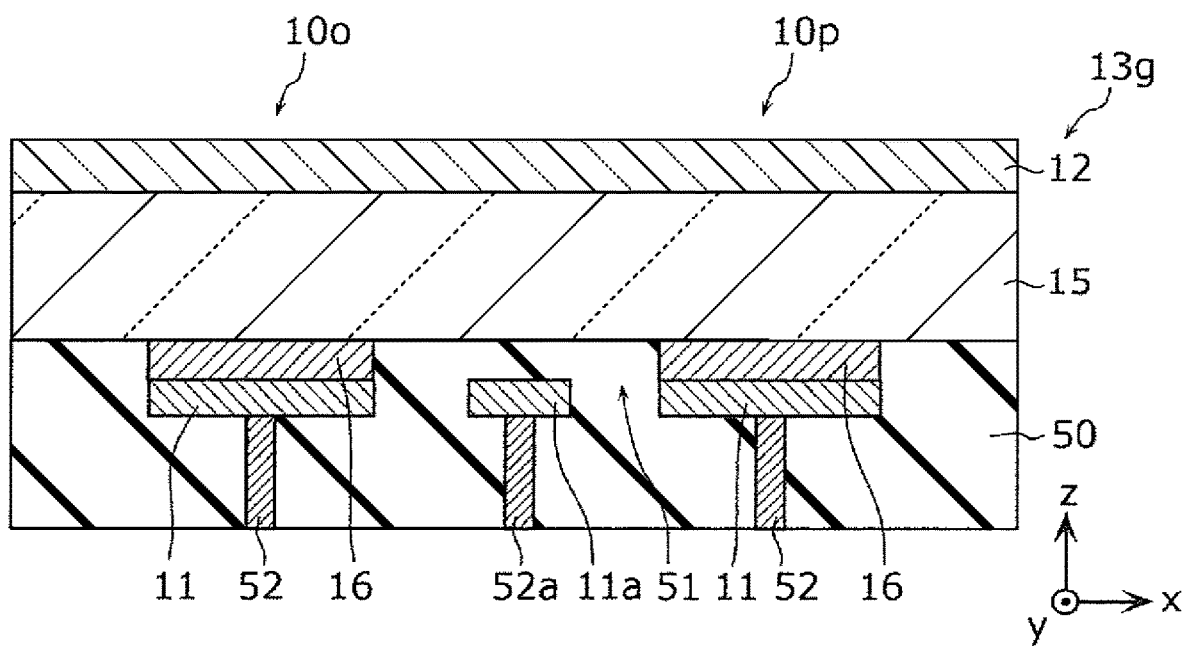
FIG. 16 is a schematic cross-sectional view illustrating a cross-sectional structure of a photoelectric converter in an imaging device of another example of the sixth embodiment.
Figure 17:
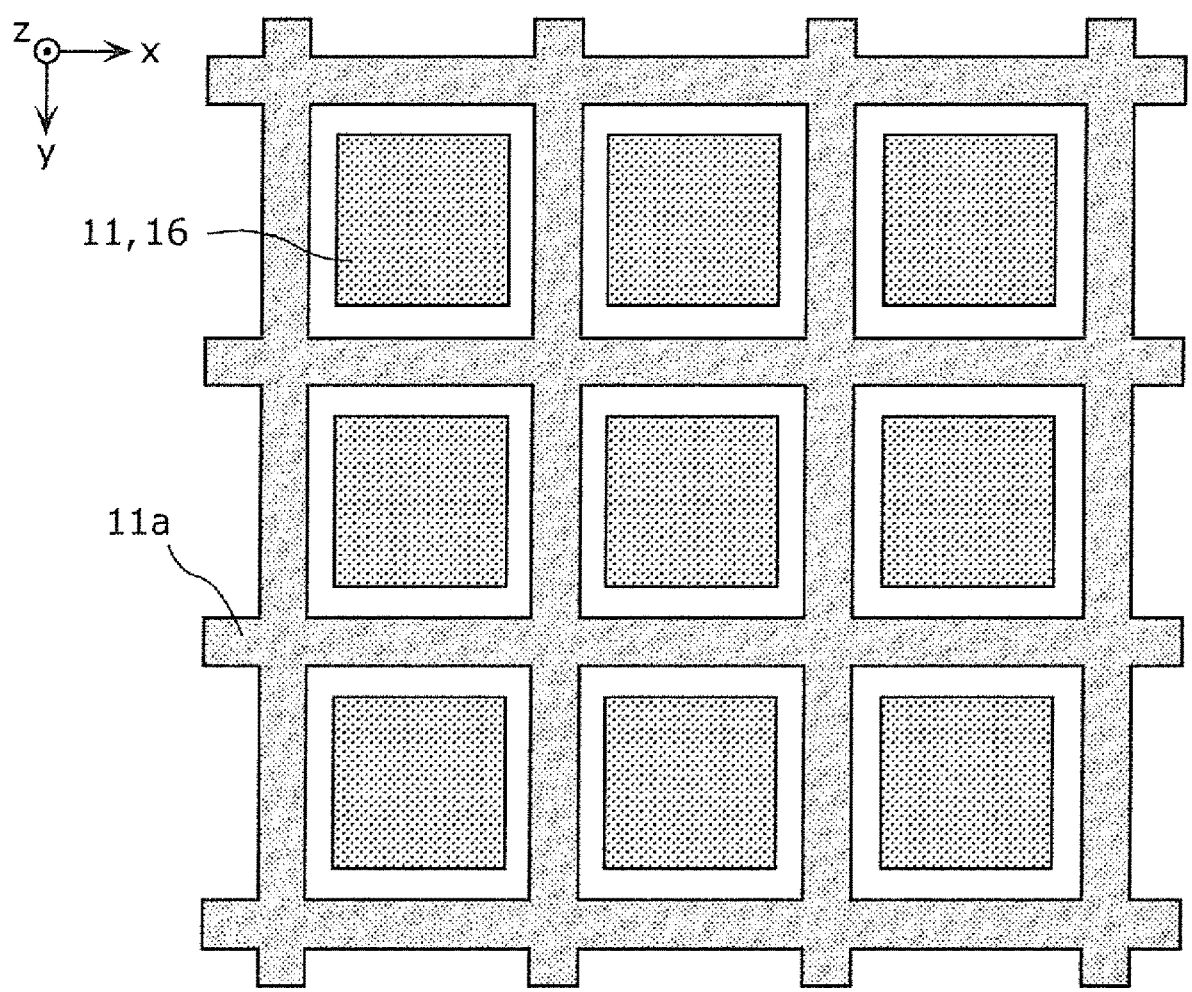
FIG. 17 is a plan view of a planar layout of pixel electrodes, shield electrode, and electron-blocking layers in the other example of the sixth embodiment.

An imaging device of another example of the sixth embodiment is described below. FIG. 16 is a schematic cross-sectional view illustrating a cross-sectional structure of a photoelectric converter 13*g* in the imaging device of the other example of the sixth embodiment. FIG. 16 illustrates the photoelectric converter 13*g* disposed to straddle two adjacent pixels 10*o* and 10*p*. FIG. 16 also illustrates part of the interlayer insulation layer 50. FIG. 17 is a plan view of a planar layout of pixel electrodes 11, shield electrode 11*a*, and electron-blocking layers 16 in the other example of the sixth embodiment. Elements other than the pixel electrodes 11, shield electrode 11*a*, and electron-blocking layers 16 are not illustrated in FIG. 17.

Referring to FIG. 16, the two adjacent pixels 10*o* and 10*p* include the counter electrode 12 and the photoelectric conversion layer 15. The counter electrode 12 and the photoelectric conversion layer 15 are disposed to straddle the two adjacent pixels 10*o* and 10*p*. Each of the two adjacent pixels 10*o* and 10*p* has its own electron-blocking layer 16 and pixel electrode 11. The photoelectric converter 13*g* includes the interlayer insulation layer 51 that insulates the electron-blocking layer 16 of the pixel 10*o* from the electron-blocking layer 16 of the pixel 10*p*. The electron-blocking layer 16 of the pixel 10*o* is separated from the electron-blocking layer 16 of the pixel 10*p* by the interlayer insulation layer 51. The photoelectric converter 13*g* includes the shield electrode 11*a* between the pixel electrode 11 of the pixel 10*o* and the pixel electrode 11 of the pixel 10*p*. The shield electrode 11*a* is disposed within the interlayer insulation layer 50 and the top surface of the shield electrode 11*a* is in contact with the interlayer insulation layer 51. Specifically, the photoelectric conversion layer 15 is insulated from the shield electrode 11*a* by the interlayer insulation layer 51. The top surface of the interlayer insulation layer 51 and the top surface of the electron-blocking layer 16 form a flat surface.

Referring to FIG. 17, multiple pixel electrodes 11, each square in plan view, are arranged in an array of rows and column. Each electron-blocking layer 16 is also square in plan view. The shield electrode 11*a* in a lattice structure is disposed between adjacent pixel electrodes 11 in a manner such that the shield electrode 11*a* is not in contact with the pixel electrodes 11 and the electron-blocking layers 16.

In plan view, the electron-blocking layer 16 is equal in area to the corresponding pixel electrode 11 in each pixel and the electron-blocking layer 16 and the corresponding pixel electrode 11 are disposed in a manner such that the outline of the electron-blocking layer 16 matches the outline of the corresponding pixel electrode 11 in each pixel. If the outline of the electron-blocking layer 16 matches the outline of the corresponding pixel electrode 11 in position in each pixel, the pixel electrode 11 and the electron-blocking layer 16 are more easily formed on the interlayer insulation layer 50.

Seventh Embodiment

A seventh embodiment is disclosed below. The seventh embodiment is different from the first embodiment in that the seventh embodiment includes two types of pixel electrodes with one type being smaller than the other and a color filter on or above a photoelectric converter. The following discussion focuses on the difference between the seventh embodiment and each of the first through the sixth embodiments and points in common are only briefly described or not described at all.

Figure 18:
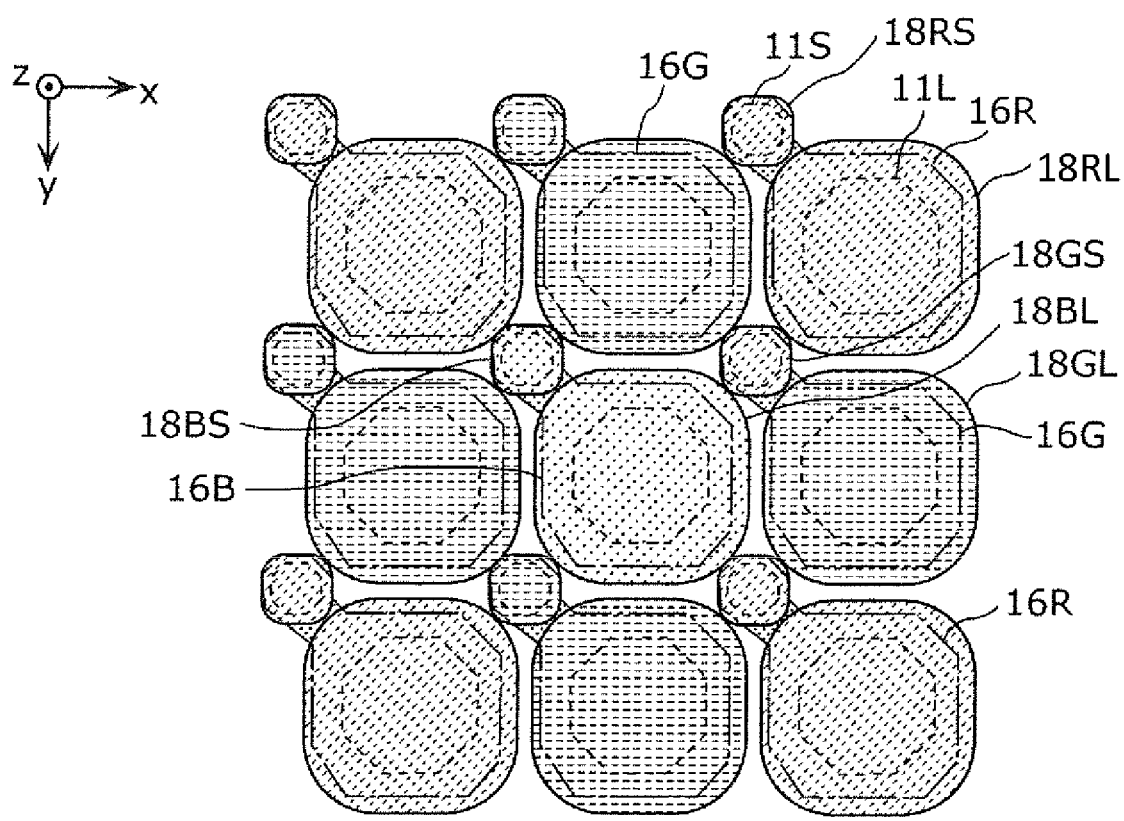
FIG. 18 is a plan view of a planar layout of pixel electrodes, electron-blocking layers, and color filters in an imaging device of a seventh embodiment.

FIG. 18 is a plan view of a planar layout of pixel electrodes 11L and 11S, electron-blocking layers 16R, 16G, and 16B, and color filters 18RL, 18RS, 18GL, 18GS, 18BL, and 18BS in the seventh embodiment. FIG. 18 does not illustrate elements other than the pixel electrodes 11L and 11S, the electron-blocking layers 16R, 16G, and 16B, and the color filters 18RL, 18RS, 18GL, 18GS, 18BL, and 18BS. As described below, the imaging device of the seventh embodiment may provide improvements in area usage efficiency and yield by patterning an electron-blocking layer in view of the pattern of the color filters.

Referring to FIG. 18, multiple small-size pixel electrodes 11S and multiple large-size pixel electrodes 11L are arranged in a manner such that the pixel electrode 11S and the pixel electrode 11L are alternately disposed at a slant angle of about 45 degrees. In plan view, the pixel electrode 11L is larger in area than the pixel electrode 11S. Each pixel electrode 11L and each pixel electrode 11S are regular octagon in plan view.

The pixel electrode 11L captures a higher amount of signal charges because of a larger area thereof and is thus able to acquire an image at a higher gain even under a lower light level condition that results in a lower generation level of signal charges. When a higher amount of signal charges is generated under a higher light level condition, the pixel electrode 11S having a lower area may reduce the amount of signal charges to be captured. An image at a high illumination level thus results. For this reason, an imaging device with a larger dynamic range is implemented. In contrast with the area of the pixel electrode, from the standpoint of reducing noise, an accumulation capacity of signal charges captured by the pixel electrode 11L may be desirably smaller while an accumulation capacity of signal charges captured by the pixel electrode 11S may be desirably larger.

The small-sized pixel electrodes 11S and the large-sized pixel electrodes 11L are alternately arranged. The small-sized pixel electrodes 11S are efficiently arranged between the large-sized pixel electrodes 11L, leading to an higher area utilization efficiency.

Large-sized and small-sized color filters of the same color 18RL and 18RS, or 18GL and 18GS, or 18BL and 18GS are disposed on or above the large-sized and small-sized pixel electrode 11L and 11S adjacent to each other at a slant angle of about 45 degrees in a manner such that the color filters entirely cover the large-sized and small-sized pixel electrodes 11L and 11S.

The color filters 18RL and 18RS are red transmission filters that are transparent to a red color and block light other than the red light within the visible light range. The color filters 18GL and 18GS are green transmission filters that are transparent to a green color and block light other than the green light within the visible light range. The color filters 18BL and 18BS are blue transmission filters that are transparent to a blue color and block light other than the blue light within the visible light range. The area of each of the color filters 18RL, 18GL, and 18BL is larger than the area of each of the color filters 18RS, 18GS, and 18BS.

The electron-blocking layer 16R, 16G, or 16B is disposed on the large-sized and small-sized pixel electrodes 11L and 11S adjacent to each other at a slant angle of about 45 degrees. Large-sized and small-sized color filters of the same color 18RL and 18RS, 18GL and 18GS, and 18BL and 18GS are respectively disposed on or above the electron-blocking layers 16R, 16G, and 16B.

Since the large-sized and small-sized color filters of the same color 18RL and 18RS, 18GL and 18GS, or 18BL and 18GS are respectively disposed on the large-sized and small-sized pixel electrode 11L and 11S disposed at an angle of about 45 degrees, the imaging device may have an increased layout area per color filter and may be free from patterning a fine color filter for each pixel electrode. Referring to FIG. 18, the electron-blocking layer 16R, 16G, or 16B disposed on or below the large-sized and small-sized color filters of the same color may be patterned without separating the large-sized and small-sized pixel electrodes 11L and 11S disposed at an angle of about 45 degrees. As a result, the imaging device has an increased layout area of the electron-blocking layer 16R, 16G, or 16B, and is free from patterning a fine color filter for each of the pixel electrodes 11L and 11S. Relaxed processing accuracy may thus be acceptable, leading to a higher yield.

The color filters of the imaging device of the seventh embodiment are arranged in the Bayer layout of a typical filter. Referring to FIG. 18, the color filters 18GL and 18GS as the green transmission filters are adjacent to each other at a slant angle. In this case, every two adjacent electron-blocking layers 16G may remain connected as a single electron-blocking layer 16G without being separated through patterning. Color mixing is alleviated in the movement of signal charges between the same color filter regions in comparison with the movement of signal charges between different color filter regions. The electron-blocking layer is thus formed straddling multiple pixel electrodes. The electron-blocking layer 16G may be separated into two adjacent blocking layers as illustrated in FIG. 18 such that they are consistent in layout regularity with the electron-blocking layers 16R and the electron-blocking layers 16B on a pixel array. A yield increase may thus result.

A shield electrode may be disposed between the pixel electrodes 11L and 11S in the imaging device of the seventh embodiment. A shield electrode may not necessarily be disposed between the pixel electrodes 11L and 11S on or below the same color filters.

Eighth Embodiment

An eighth embodiment is described below.

Figure 19:
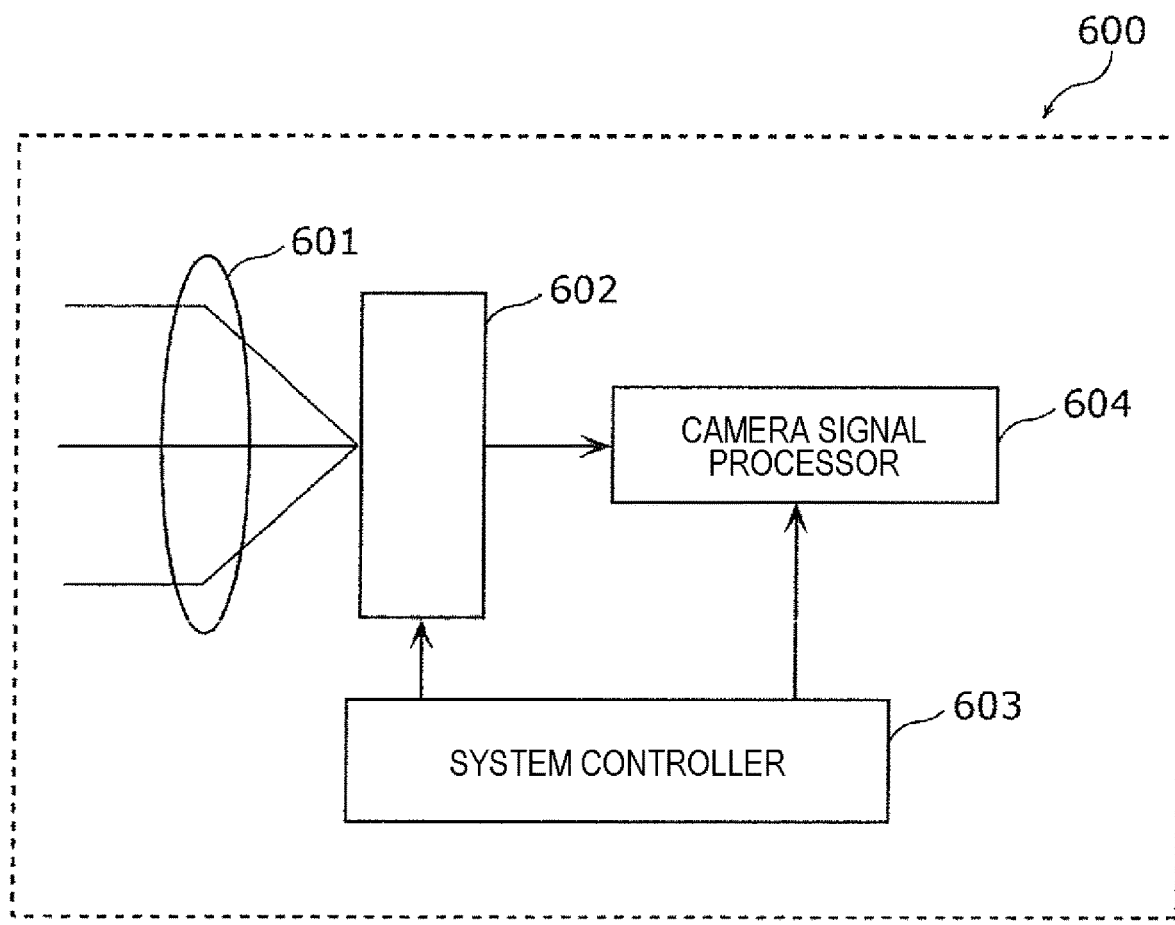
FIG. 19 is a block diagram illustrating a structure of a camera system of an eighth embodiment.

FIG. 19 is a block diagram illustrating a structure of a camera system 600 of an eighth embodiment.

Referring to FIG. 19, the camera system 600 includes a lens optical system 601, an imaging device 602, a system controller 603, and a camera signal processor 604.

The lens optical system 601 includes an autofocus lens, a zoom lens, and diaphragm. The lens optical system 601 collects light on an imaging surface of the imaging device 602. Light having transmitted through the lens optical system 601 is incident on the side of the counter electrode 12 and photoelectrically converted by the photoelectric conversion layer 15. The imaging device 602 may be one of the imaging devices of the first through seventh embodiments.

The system controller 603 controls the whole of the camera system 600. For example, the system controller 603 may be implemented by a microcomputer.

The camera signal processor 604 processes an output signal from the imaging device 602. For example, the camera signal processor 604 performs a variety of operations, including gamma correction, color interpolation processing, spatial interpolation processing, auto white balance, distance measurement calculation, and wavelength information separation. The camera signal processor 604 may be implemented by a digital signal processor (DSP).

The camera system 600 of the eight embodiment may provide a higher quality camera system by using the imaging device of one of the first through seventh embodiments.

Other Embodiments

One or more imaging devices have been described with referent to the embodiments. The disclosure is not limited to the embodiments. Without departing from the scope of the disclosure, a variety of modifications of each of the embodiments contemplated by those skilled in the art and an embodiment as a result of combining elements of different embodiments may fall within the scope of the disclosure.

In the fourth and fifth embodiments, the electron-blocking layer on the shield electrode is separated from both of the electron-blocking layers on the two pixel electrodes. The disclosure is not limited to this configuration. One of the electron-blocking layers of the two pixel electrodes may be connected to the electron-blocking layer on the shield electrode.

In each of the embodiments, the photoelectric converter includes the counter electrode, the photoelectric conversion layer, the electron-blocking layer, and the pixel electrode. The disclosure is not limited to this configuration. The photoelectric converter may further include a charge transport layer and a charge-blocking layer that is different from the electron-blocking layer. The number of the photoelectric conversion layers is not limited to one and multiple photoelectric conversion layers may be laminated.

The imaging devices according to the disclosure may be applicable to a variety of camera systems and sensor systems, including medical cameras, surveillance cameras, onboard cameras, distance measuring cameras, microscope cameras, cameras for drone, and cameras for robot.

What is claimed is:

1. An imaging device comprising:
a first pixel; and
a second pixel adjacent to the first pixel, wherein:
each of the first pixel and the second pixel includes:
a first electrode;
a second electrode positioned on or above the first electrode and facing the first electrode;
a photoelectric conversion layer positioned between the first electrode and the second electrode; and
a first charge-blocking layer positioned between the first electrode and the photoelectric conversion layer,
the first charge-blocking layer of the first pixel is separated from the first charge-blocking layer of the second pixel,
an area of the first charge-blocking layer of the first pixel is larger than an area of the first electrode of the first pixel in plan view,
the imaging device further comprises:
a first insulation layer positioned on or below the first charge-blocking layer of the first pixel and the first charge-blocking layer of the second pixel; and a second insulation layer positioned between the first charge-blocking layer of the first pixel and the first charge-blocking layer of the second pixel, and the first insulation layer and the second insulation layer contain a same material.

2. An imaging device comprising:

a first pixel; and a second pixel adjacent to the first pixel, wherein:

each of the first pixel and the second pixel includes:
- a first electrode;
- a second electrode positioned on or above the first electrode and facing the first electrode;
- a photoelectric conversion layer positioned between the first electrode and the second electrode; and
- a first charge-blocking layer positioned between the first electrode and the photoelectric conversion layer, the first charge-blocking layer of the first pixel is separated from the first charge-blocking layer of the second pixel, an area of the first charge-blocking layer of the first pixel is larger than an area of the first electrode of the first pixel in plan view, and the imaging device further comprises:
- a first insulation layer positioned on or below the first charge-blocking layer of the first pixel and the first charge-blocking layer of the second pixel;
- a second insulation layer positioned between the first charge-blocking layer of the first pixel and the first charge-blocking layer of the second pixel; and
- a third electrode that is in contact with the second insulation layer and positioned in plan view between the first electrode of the first pixel and the first electrode of the second pixel.

3. An imaging device comprising:

a first pixel; and a second pixel adjacent to the first pixel, wherein:

each of the first pixel and the second pixel includes:
- a first electrode;
- a second electrode positioned on or above the first electrode and facing the first electrode;
- a photoelectric conversion layer positioned between the first electrode and the second electrode; and
- a first charge-blocking layer positioned between the first electrode and the photoelectric conversion layer, the first charge-blocking layer of the first pixel is separated from the first charge-blocking layer of the second pixel, an area of the first charge-blocking layer of the first pixel is larger than an area of the first electrode of the first pixel in plan view, the imaging device further comprises:
- a third electrode positioned in plan view between the first electrode of the first pixel and the first electrode of the second pixel; and
- a second charge-blocking layer positioned between the third electrode and the photoelectric conversion layer, at least one selected from the group consisting of the first charge-blocking layer of the first pixel and the first charge-blocking layer of the second pixel is separated from the second charge-blocking layer.

4. The imaging device according to claim 3, wherein an area of the second charge-blocking layer is larger than an area of the third electrode in plan view.

5. The imaging device according to claim 3, wherein the second charge-blocking layer is an electron-blocking layer.

6. The imaging device according to claim 1, wherein a portion of the photoelectric conversion layer is positioned between the first charge-blocking layer of the first pixel and the first charge-blocking layer of the second pixel.

7. An imaging device comprising:

a first pixel; and a second pixel adjacent to the first pixel, wherein each of the first pixel and the second pixel includes:
- a first electrode;
- a second electrode positioned on or above the first electrode and facing the first electrode;
- a photoelectric conversion layer positioned between the first electrode and the second electrode; and
- a first charge-blocking layer positioned between the first electrode and the photoelectric conversion layer, the first charge-blocking layer of the first pixel is separated from the first charge-blocking layer of the second pixel, and an area of the first charge-blocking layer of the first pixel is smaller than an area of the first electrode of the first pixel in plan view.

8. The imaging device according to claim 7, further comprising:
- a first insulation layer positioned on or below the first charge-blocking layer of the first pixel and the first charge-blocking layer of the second pixel; and
- a second insulation layer positioned between the first charge-blocking layer of the first pixel and the first charge-blocking layer of the second pixel.

9. The imaging device according to claim 7, further comprising:
- a third electrode positioned in plan view between the first electrode of the first pixel and the first electrode of the second pixel; and
- a second charge-blocking layer positioned between the third electrode and the photoelectric conversion layer, wherein at least one selected from the group consisting of the first charge-blocking layer of the first pixel and the first charge-blocking layer of the second pixel is separated from the second charge-blocking layer.

10. The imaging device according to claim 7, wherein the first charge-blocking layer contains a doped metal oxide or metal nitride.

11. The imaging device according to claim 7, wherein a top surface of the first charge-blocking layer is flat.

12. The imaging device according to claim 8, wherein the first insulation layer and the second insulation layer contain a same material.

13. The imaging device according to claim 8, further comprising a third electrode that is in contact with the second insulation layer and positioned in plan view between the first electrode of the first pixel and the first electrode of the second pixel.

* * * * *